(12) United States Patent
Aoki et al.

(10) Patent No.: US 6,762,106 B2
(45) Date of Patent: Jul. 13, 2004

(54) SEMICONDUCTOR DEVICE AND METHOD FOR FABRICATING THE SAME

(75) Inventors: Shigetaka Aoki, Osaka (JP); Tohru Saitoh, Osaka (JP); Katsuya Nozawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/326,059

(22) Filed: Dec. 23, 2002

(65) Prior Publication Data

US 2003/0183819 A1 Oct. 2, 2003

(30) Foreign Application Priority Data

Apr. 1, 2002 (JP) ........................................ 2002-099009

(51) Int. Cl.[7] ............................................. H01L 21/331
(52) U.S. Cl. ...................... 438/312; 438/309; 438/317; 438/318; 438/320; 438/47
(58) Field of Search .................................. 438/312, 318, 438/319, 320, 47, 235, 309

(56) References Cited

U.S. PATENT DOCUMENTS 6,552,374 B2 * 4/2003 Han et al. .................... 257/197

FOREIGN PATENT DOCUMENTS

| JP | 5-175222 | 7/1993 |
| JP | 6-69464  | 3/1994 |

* cited by examiner

*Primary Examiner*—Long Pham
(74) *Attorney, Agent, or Firm*—McDermott, Will & Emery

(57) ABSTRACT

An Si/SiGe layer including an Si buffer layer, an SiGe spacer layer, a graded SiGe layer and an Si cap layer is epitaxially grown in a region corresponding to a collector opening while a polycrystalline layer is deposited on the upper surface of a nitride film, and side surfaces of an oxide film and the nitride film. In this case, the Si buffer layer is formed first and then other layers such as the SiGe spacer layer are formed, thereby ensuring non-selective epitaxial growth. Then, a polycrystalline layer is deposited over the nitride film.

10 Claims, 18 Drawing Sheets

FIG. 8

| Epitaxial structure | $f_{Tmax}(V_{CE}=2V)$ | $f_{max}(V_{CE}=2V)$ |
|---|---|---|
| Si buffer layer included | 41.6GHz | 51.5GHz |
| No Si buffer layer included | 40.3GHz | 52.3GHz |

Solid lines indicate gas radiation step of each source gas

SEMICONDUCTOR DEVICE AND METHOD FOR FABRICATING THE SAME

BACKGROUND OF THE INVENTION

The present invention relates to semiconductor devices functioning as heterojunction bipolar transistors including epitaxial base layers, and methods for fabricating the same.

Operation speed of silicon bipolar transistors has been increased through use of progress in microfabrication and self-alignment technique. In order to further increase the operation speed, research and development of bipolar transistors with heterojunction (heterojunction bipolar transistors) has been actively conducted. More specifically, in recent years, active attempts have been made to use SiGe mixed crystalline semiconductors (i.e., SiGe heterojunction bipolar transistors which will be herein referred to as "SiGe-HBTs") as base layers.

FIGS. 14A through 14F are cross-sectional views illustrating a typical method for fabricating an SiGe-HBT using a known selective SiGe epitaxial growth technique.

First, in a process step shown in FIG. 14A, an N$^+$ impurity layer 102 is formed in an upper part of a p-type silicon substrate 101 by ion implantation, and then an N$^-$ epitaxial layer 103 is formed thereon. Thereafter, an isolation oxide film 104 is formed using a trench formation technique and an oxide film embedding technique.

Next, in a process step shown in FIG. 14B, an oxide film 105 and a nitride film 106 are deposited by CVD in this order over the substrate, and then using a photolithography technique and an etching technique, a collector opening 115 (i.e. a region where epitaxial growth is to be performed and which will be herein also referred to as a "epitaxial growth region") is formed in the nitride film 106. Furthermore, the oxide film 105 is wet-etched to remove an exposed part thereof corresponding to the collector opening 115.

Next, using molecular beam epitaxy (MBE), ultra-high vacuum chemical vapor deposition (UHV-CVD) or low-pressure chemical vapor deposition (LP-CVD), an SiGe layer 107 including an Si cap layer, an SiGe spacer layer and a graded SiGe layer is epitaxially grown in an epitaxial growth region corresponding to the collector opening 115. At this point, use of the selective SiGe epitaxial growth technology can prevent deposition of a polycrystalline layer on the nitride film 106.

Next, in a process step shown in FIG. 14C, an oxide film 109 is deposited over the substrate and then is partially removed through a photolithography technique and an etching technique so that part of the oxide film 109 is left on the center portion of the Si/Ge layer 107.

Thereafter, in a process step shown in FIG. 14D, a polysilicon film 110 that is to serve as a base lead-electrode is deposited over the substrate, and then ions of boron as an impurity are implanted into the polysilicon film 110. Thereafter, an oxide film 111 is deposited on the polysilicon film 110. Then, an emitter opening 116 is formed in the oxide film 111 and the polysilicon film 110 through a photolithography technique and an etching technique.

Next, in a process step shown in FIG. 14E, an oxide film and a nitride film are deposited over the substrate, and then anisotropic dry etching is performed to form an oxide film sidewall 118 and a nitride film sidewall 112 on each side wall of a lamination of the oxide film 111 and the polysilicon film 110. Furthermore, the oxide film 109 is wet-etched to remove an exposed part thereof corresponding to the emitter opening 116.

Thereafter, in a process step shown in FIG. 14F, an n-type polysilicon film that is to serve as an emitter electrode is deposited over the substrate. Subsequently, using a photolithography technique and an etching technique, the polysilicon film is patterned and an emitter polysilicon electrode 113 is formed. Thereafter, thermal annealing such as RTA is performed to diffuse an n-type impurity from the emitter polysilicon electrode 113 into the Si cap layer in the Si/SiGe layer 107 such that an Si emitter layer is formed on an SiGe base layer. In this manner, an emitter and base junction is formed.

By following the process steps described above, an SiGe-HBT having an Si—SiGe heterojunction is formed.

FIG. 15 shows a schematic cross-section of an Si/SiGe layer 107 of an SiGe-HBT taken along the line XV—XV shown in FIG. 14F and the profile of the Ge content of the Si/SiGe layer 107 in the depth direction. As shown in FIG. 15, the Si/SiGe layer 107 includes a non-doped SiGe spacer layer 107a located directly on the N$^-$ epitaxial layer 103, a graded SiGe layer 107b provided on the SiGe spacer layer 107a, and an Si cap layer 107c. The upper portion of the Si cap layer 107c is doped with an n-type impurity by diffusion to serve as an emitter layer while the lower portion of the cap layer 107c serves as part of a base layer. In the graded SiGe layer 107b, the Ge content decreases gradually in the direction heading from the SiGe spacer layer 107a to the Si cap layer 107c.

FIG. 16 is a timing chart showing a sequence of standard process steps of known SiGe epitaxial growth. Epitaxial growth of an SiGe film using UHV-CVD will be described herein. However, an epitaxial film can be also grown in a similar manner using LP-CVD or MBE.

As shown in FIG. 16, a wafer is loaded into a reaction chamber at a timing t100. Then, the temperature of the wafer is increased to a high temperature ranging from about 650° C. to 800° C. for a period from a timing t101 to a timing t102. Then, annealing (pre-cleaning) is performed for a period from the timing t102 to a timing t103 (e.g., for about 2 to 20 min.). Specifically, a natural oxide film formed on the upper surface of a semiconductor substrate is reacted with silicon in the substrate so that SiO having a high vapor pressure is removed (sublimated) thereon. As a result, a clean Si surface is exposed in a region where epitaxial growth is intended to be performed. The reaction is represented by the following formula:

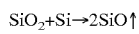

$$SiO_2 + Si \rightarrow 2SiO\uparrow$$

Next, for a period from the timing t103 to a timing t104, the wafer temperature is reduced to a growth temperature ranging from about 500° C. to 650° C., and then the wafer is held to stand for a period from the timing t104 to a timing t105 until the temperature distribution of the wafer surface is uniformalized. At the timing t105, each layer is started to be grown by introducing source gases such as disilane, monogermane and diboran into a process chamber at respective predetermined flow rates. In this case, for example, an SiGe spacer layer 107a is formed by supplying disilane ($Si_2H_6$) and monogerman ($GeH_4$) to the upper surface of the wafer at constant flow rates, respectively, for a period from the timing t105 to a timing t106. For the period from a timing t106 to a timing t107, a graded SiGe layer 107b is grown by reducing the flow rate of monogerman gradually under the condition that the flow rates of disilane and diboran ($B_2H_6$) are kept constant and thereby grading the Ge content. Furthermore, an Si cap layer 107c is grown by supplying disilane to the upper surface of the wafer at a constant flow rate for a predetermined period of time from the timing t107.

Meanwhile, in recent years, non-selective epitaxial SiGe growth technique have been regarded as promising techniques that allow achievement of high-performance SiGe-HBTs. In the non-selective SiGe epitaxial growth techniques, as disclosed in Japanese Unexamined Patent Publication No. 5-175222 and Japanese Unexamined Patent Publication No. 6-69434, an SiGe epitaxial film is grown on an silicon layer while an SiGe polycrystalline film is grown on an insulating film, such as an oxide film and a nitride film, located around the silicon layer. When such a non-selective epitaxial growth technique is applied to the process steps shown in FIGS. 14A through 14F, a polycrystalline Si/SiGe film is formed between the nitride film 106 and the polysilicon film 110 and thus the polysilicon film 110 and the polycrystalline Si/SiGe film serve as a base lead-electrode, resulting in reduction in resistance of the base lead-electrode.

Such non-selective SiGe epitaxial growth techniques for use in fabricating SiGe-HBTs are regarded as promising techniques that allow improvement of electric properties of transistors and stable transistor production from the following points.

(1) A polycrystalline SiGe film is formed on the insulating film while a single crystalline SiGe film is epitaxially grown over a substrate. In general, the polycrystalline SiGe film has a lower specific resistance than a polycrystalline Si film. More specifically, in an SiGe-HBT, an SiGe polycrystalline film heavily doped with B can be used as part of a base lead-electrode of the bipolar transistor. Accordingly, the base resistance can be further reduced.

(2) In a BiCMOS process, a polycrystalline SiGe film can be used not only as part of a base lead-electrode of a bipolar transistor but also as a gate electrode of an MOS transistor. Thus, the gate resistance and the number of process steps can be reduced.

(3) When a selective SiGe epitaxial growth technique is used, growth selectivity is reduced due to small changes in growth conditions, thus easily causing the phenomenon that polycrystals are formed in the form of islands on an insulating film or like phenomena. In other words, a process margin is small, thus easily causing abnormal states in process steps. In contrast, when a non-selective epitaxial growth technique is used, a polycrystalline film is formed on the insulating film. Therefore such abnormal states as caused by epitaxial growth is said hardly appear.

As have been described, although non-selective SiGe epitaxial growth techniques are promising techniques in terms of improving electric properties of SiGe-HBTs, the following problems caused by the techniques have been found.

(1) Unlike epitaxial growth on an silicon layer, epitaxial growth does not start on an insulating film such as an oxide film and a nitride film until the density of growth nuclei (critical nuclei) larger than a certain grain size that have been formed thereon reaches or exceeds a certain level. Accordingly, in the case of epitaxial growth on the insulating layer, a time lag (latent time) occurs between the start of film growth and the start of supply of a process gas.

(2) As the Ge content of SiGe is increased, non-selectivity is reduced (that is, the latent time becomes longer).

Due to the problem (1), even if the SiGe polycrystalline film is intended to be used as part of the base lead-electrode, a polycrystalline film having a sufficient thickness can not be formed on the insulating layer during epitaxial growth of an Si/SiGe layer. This may result in failure of reduction in base resistance. Moreover, the problem (2) makes it difficult to simultaneously achieve both of reduction in base resistance by non-selective SiGe epitaxial growth and improvement of high-frequency properties by the increase in the Ge content.

FIG. 17A is an SEM photo showing a cross-section of an SiGe epitaxial film with the structure of the known semiconductor device formed by non-selective epitaxial growth. In a sample used for analysis of the cross-sectional structure, however, the formation of the oxide film 105 and the nitride film 106 as shown in FIG. 14B were omitted. The photo of FIG. 17A was taken using the sample including a 40 nm thick SiGe spacer layer 107a with a 15% Ge content, a 40 nm thick graded SiGe layer 107b in which the Ge content is graded from 15% to 0% and a 30 nm thick Si cap layer 107c. As shown in FIG. 17A, the epitaxially grown Si/SiGe layer 107 exists on the N⁻ collector layer 103, whereas on the isolation oxide film 104, only island-shaped polycrystals but no polycrystalline film is formed.

FIG. 18 is an illustration schematically showing the relation between the thickness of a grown film and the radiation time during which a source gas is supplied for the SiGe epitaxial film, the Si epitaxial film, and the polycrystalline Si and SiGe films formed on the insulating film, for the purpose of further describing the causes of the problems (1) and (2). The following is what can be seen from FIG. 18.

In general, an SiGe epitaxial film has a greater growth rate than an Si epitaxial film. The growth rate of the SiGe epitaxial film increases as the Ge content of SiGe increases.

In forming a polycrystalline Si film or a polycrystalline SiGe film on an insulating film, formation of growth nuclei of SiGe resulting from decomposition of a source gas conflicts with the elimination reaction of the resultant SiGe from the surface of the insulating film, thus resulting in a time lag (latent time) from the start of supply of the source gas. In other words, dangling bonds of atoms of materials included in the insulating layer are terminated on its surface, and therefore a certain time period is required before the formation of the critical nuclei starts on the surface of the insulating layer. However, silicon atoms having dangling bonds are exposed on the surface of a silicon layer, and thus epitaxial growth of an Si film or an SiGe film starts at around the same time when the source gas is started to be supplied. Accordingly, the latent time can be counted as zero.

Meanwhile, in an SiGe-HBT, the thickness of an Si/SiGe layer 107 should be determined at a certain value in view of device design (i.e., electric properties that are intended to be achieved), and thus an Si/SiGe layer 107 having a greater thickness than the value can not be formed. Moreover, it is well known that use of an SiGe epitaxial film with a greater Ge content is advantageous to improvement of the high-frequency properties of the SiGe-HBT. Specifically, the growth rate of the SiGe epitaxial film increases with the increasing Ge content of SiGe. Thus, epitaxial growth of a single crystalline SiGe film tends to be completed in a shorter time, whereas the latent time before the formation of growth nuclei for epitaxial growth of a polycrystalline SiGe film tends to become longer. This is probably the reason that, in the SiGe-HBT including a base layer with a high Ge content, i.e., an about 11% Ge content (on average), only an island-shaped SiGe polycrystals have been grown as shown in FIG. 17A.

As has been described, it has been found that in the SiGe-HBT, it is basically difficult to form a polycrystalline film having a sufficient thickness on an insulating layer by non-selective epitaxial growth since epitaxial growth of an SiGe film is required to be performed under the constraint that the Si/SiGe layer 107 and the SiGe film of the Si/SiGe layer 107 should have respective predetermined thicknesses. Moreover, as the Ge content of the SiGe epitaxial film is increased for the purpose of improving electric properties of a semiconductor device such as the SiGe-HBT, it becomes more difficult to form a polycrystalline film.

Furthermore, the polycrystalline film formed on the surface of the insulating layer is to serve as a underlying layer in a subsequent process step. Therefore, the polycrystalline film should have a fine surface morphology so that lithograpy and dry-etching processes can be stably performed.

For details of the relation between Ge content and selectivity, refer to, for example, the following paper: K. Aketagawa Jpn J. Appl. Phys. Vol. 31 (1992) pp. 1432–1435, "Selective Epitaxial Growth of Si and Si1-xGex Films by Ultrahigh-Vacuum Chemical Vapor Deposition Using Si2H6 and GeH4".

SUMMARY OF THE INVENTION

An object of the present invention is to provide, by taking measures for improving non-selectivity of SiGe epitaxial growth, a semiconductor device, such as an SiGe-HBT, that allows the formation of a polycrystalline film having a sufficient thickness on the surface of an insulating layer currently with the formation of a single crystalline epitaxial layer on the surface of a single crystalline semiconductor layer while fully maintaining its properties as designed, and a method for fabricating the same.

A semiconductor device according to the present invention includes: a single crystalline underlying layer formed in part of a substrate; an insulating layer formed in another part of the substrate; a semiconductor layer epitaxially grown above the underlying layer and having a composition represented by $Si_{1-x1-y1}Ge_{x1}C_{y1}$ (where $0<x1<1$, $0\leq y1<1$); a buffer layer epitaxially grown between the underlying layer and the semiconductor layer and having a composition represented by $Si_{1-x2-y2}Ge_{x2}C_{y2}$ (where $0\leq x2<1$, $0\leq y2<1$, $1-x2-y2>1-x1-y1$); and a polycrystalline semiconductor layer formed on the insulating layer and including a semiconductor having substantially the same composition as the buffer layer and a semiconductor having substantially the same composition as the semiconductor layer.

According to this structure, the buffer layer having a greater Si content than the semiconductor layer is provided between the underlying layer and the semiconductor layer and the polycrystalline semiconductor layer formed on the insulating layer includes a semiconductor having substantially the same composition as the buffer layer. Accordingly, non-selectivity can be improved and thus a polycrystalline layer having a relatively great thickness can be obtained.

The single crystalline underlying layer is preferably a silicon layer.

The semiconductor layer is an SiGe layer or an SiGeC layer, the buffer layer is a silicon layer and the polycrystalline semiconductor layer contains at least SiGe. Accordingly, a polycrystalline layer including polycrystalline SiGe having a small resistance can be obtained.

A semiconductor device in which the underlying layer is a collector layer, the semiconductor layer has at least part serving as a base layer and the polycrystalline semiconductor layer serves as at least part of a base lead-electrode and which functions as a heterojunction bipolar transistor can be also obtained.

A semiconductor in which the polycrystalline semiconductor layer serves as at least part of an MIS transistor and which functions as a BiCMOS device can be formed.

The buffer layer preferably has a thickness of not less than 2 nm nor more than 20 nm.

A method for fabricating a semiconductor device according to the present invention includes the steps of: (a) pre-cleaning a substrate including a single crystalline underlying layer having a composition represented by $Si_{1-x3-y3}Ge_{x3}C_{y3}$ (where $0\leq x3<1$, $0\leq y3<1$) and an insulating layer; (b) forming, after the step (a), a buffer layer having a composition represented by $Si_{1-x2-y2}Ge_{x2}C_{y2}$ (where $0\leq x2<1$, $0\leq y2<1$) on the underlying layer while depositing a first polycrystalline semiconductor layer having substantially the same composition as the buffer layer on the insulating layer; and (c) forming, after the step (b), a semiconductor layer having a composition represented by $Si_{1-x1-y1}Ge_{x1}C_{y1}$ (where $0<x1<1$, $0\leq y1<1$) on the buffer layer while depositing over the insulating layer a second polycrystalline semiconductor layer having substantially the same composition as the semiconductor layer so that the second polycrystalline semiconductor layer covers the first polycrystalline semiconductor layer, wherein a relation represented by the inequality of $1-x2-y2>1-x1-y1$ holds between both the compositions of the semiconductor layer and the buffer layer.

According to the method, since the buffer layer has a relatively great Si content in the step (b), a time which it takes to perform the step (b) is relatively long. Accordingly, during the step (b), formation of the first polycrystalline layer in the form of islands or a continuous film on the insulating layer is ensured. Then, in the step (c), the first polycrystalline layer promotes formation of a second polycrystalline layer, so that the first and second polycrystalline layers having a great thickness as a whole can be achieved. That is to say, non-selectivity for epitaxial growth in the step (c) can be improved.

In the step (b), the first polycrystalline semiconductor is preferably formed as substantially a continuous film.

The temperature of the substrate is preferably lower when the step (b) is performed than that when the step (c) is performed. In this case, a longer time taken to perform the step (b) can be ensured as compared to the case where the substrate has a high temperature when the step (b) is performed, if the buffer layer is intended to be deposited to the same thickness in both cases. Accordingly, formation of the first polycrystalline semiconductor layer on the insulating layer can be ensured.

The difference between the substrate temperatures in the steps (b) and (c) is preferably within the range from 10° C. to 100° C.

In the step (a), the substrate is held at a high temperature and then the substrate temperature is reduced to a level where the step (b) is performed, and nuclei for epitaxial growth of the first or second polycrystalline semiconductor layer to be performed in the step (c) are formed on the insulating layer at a time point during the temperature reduction in the step (a). Accordingly, nuclei can be actively formed on the surface of the insulating layer, thus improving non-selectivity for epitaxial growth in the step (c) that is to be subsequently performed.

The semiconductor layer is preferably an SiGe layer or an SiGeC layer and the buffer layer is preferably a silicon layer.

By forming a semiconductor device in which the underlying layer is a collector layer, the semiconductor layer has at least part serving as a base layer and the first and second polycrystalline semiconductor layers serve as at least parts of a base lead-electrode, and which the semiconductor device functions as a heterojunction bipolar transistor, a heterojunction bipolar transistor in which a base resistance is small can be formed.

A semiconductor device in which the first and second polycrystalline layers serve at least parts of an MIS transistor and which functions as a BiCMOS device can be also formed.

The steps (b) and (c) are preferably performed under ultra high vacuum.

The temperature of the substrate is preferably in the range from 400° C. to 650° C. when the steps (b) and (c) are preferably performed.

BRIEF DESCRIPTION OF THE DRAWINGS

FIG. 8 is a table showing the differences between measured values for the high-frequency properties of two SiGe-HBT samples, one including the Si buffer layer and the other not, formed according to the present invention.

DESCRIPTION OF THE PREFERRED EMBODIMENTS (First Embodiment)

Figure 1:
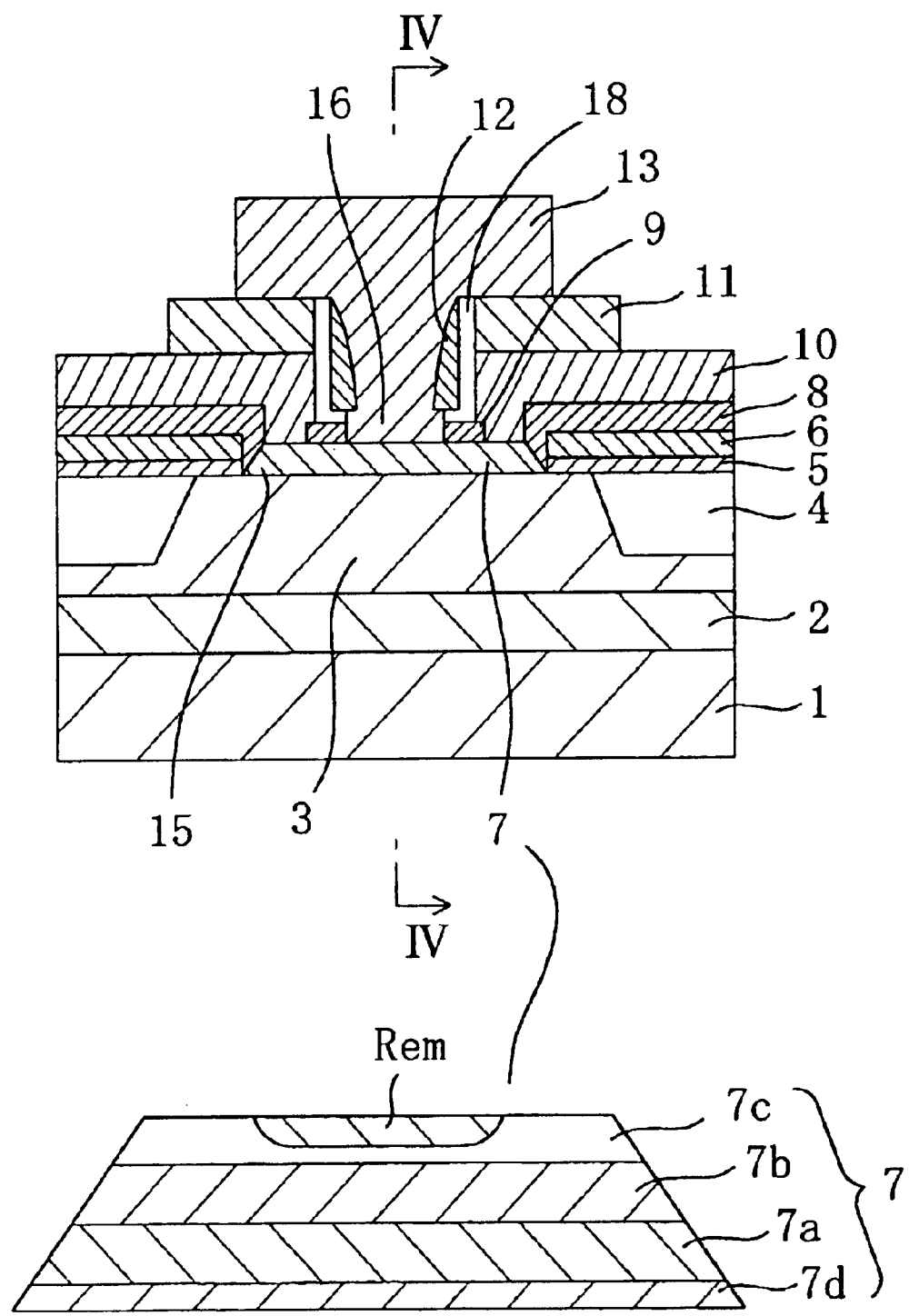
FIG. 1 shows a cross-sectional view of an SiGe-HBT that is a semiconductor device commonly described in each of embodiments of the present invention.

FIG. 1 shows a cross-sectional view of an SiGe-HBT that is a semiconductor device commonly described in each of embodiments of the present invention.

As shown in FIG. 1, the SiGe-HBT of this embodiment includes: a p-type silicon substrate 1; an N$^+$ impurity layer 2 formed in the silicon substrate 1; an N$^-$ epitaxial layer 3 formed over the silicon substrate 1; an isolation oxide film 4 for defining and surrounding an active region; an oxide film 5 and a nitride film 6 on the oxide film 5 both having a collector opening 15 (epitaxial growth region); an Si/SiGe layer 7 including an Si buffer layer 7d formed in the epitaxial growth region corresponding to the collector opening 15 over the substrate, an SiGe spacer layer 7a, a graded SiGe layer 7b and an Si cap layer 7c; a polycrystalline layer 8; an oxide film 9 having an emitter opening 16; a polysilicon film 10 that is to serve as a base lead-electrode; an oxide film 11 deposited on the polysilicon film 10; an oxide film sidewall 18 and a nitride film sidewall 12 formed on each side wall of a lamination of the oxide film 11 and the polysilicon film 10; and an emitter polysilicon electrode 13 containing an n-type impurity. As shown in a magnified view illustrated in the bottom part of FIG. 1, an emitter region Rem containing an n-type impurity diffused from the emitter polysilicon electrode 13 is formed in the Si cap layer 7c of the Si/SiGe layer 7.

FIGS. 2A through 2C and 3A through 3C are cross-sectional views illustrating process steps of a method for fabricating the SiGe-HBT of this embodiment.

Figure 2A:
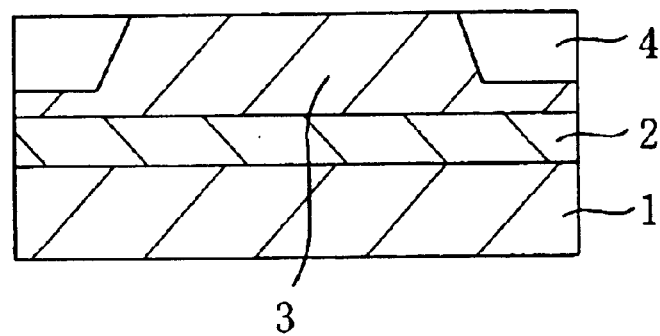
FIGS. 2A through 2C are cross-sectional views illustrating the first half of process steps of a method for fabricating an SiGe-HBT according to the second embodiment of the present invention.

First, in a process step shown in FIG. 2A, an N$^+$ impurity layer 2 is formed in an upper part of a p-type silicon substrate 1 by ion implantation, and then an N$^-$ epitaxial layer 3 that is a silicon layer having a thickness of 500 nm is formed thereover. Thereafter, an isolation oxide film 4 is formed so as to surround a collector layer of the SiGe-HTB, using a trench formation technique and an oxide film embedding technique. Although not shown in FIGS. 2A through 3C, a collector wall layer for leading out a current from a collector electrode is formed on the right of one of the isolation oxide films 4 shown in the figures.

Figure 2B:
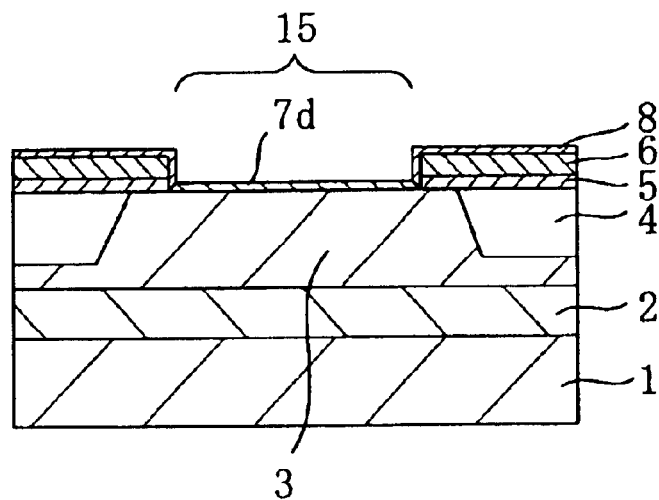
Figure 2C:
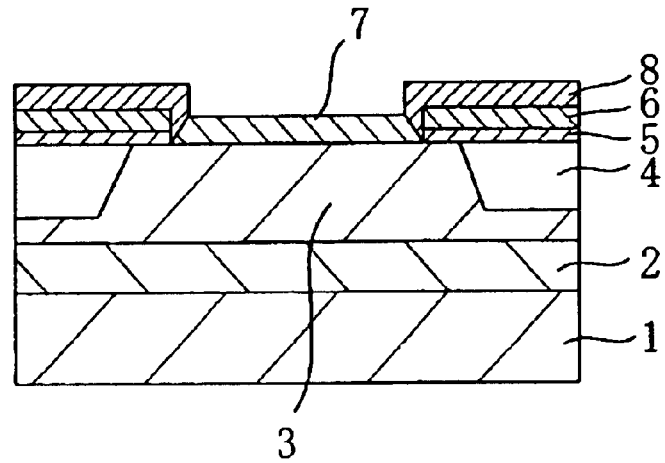

Next, in a process step shown in FIGS. 2B and 2C, an oxide film 5 and a nitride film 6 each at a thickness of 50 nm are deposited by CVD in this order over the substrate, and then using a photolithography technique and an etching technique, a collector opening 15 (epitaxial growth region) is formed in the nitride film 6. Furthermore, the oxide film 5 is wet-etched to remove an exposed part thereof corresponding to the collector opening 15.

Next, using MBE, UHV-CVD or LP-CVD, an Si buffer layer 7d, an SiGe spacer layer 7a, a graded SiGe layer 7b and an Si cap layer 7c are epitaxially grown in this order to respective thicknesses of 10 nm, 40 nm, 40 nm and 30 nm in a region corresponding to the collector opening 15, to form an Si/SiGe layer 7 with a total thickness of 120 nm while a polycrystalline layer 8 is formed on the upper surface of the nitride film 6 and each of the side walls of a lamination of the oxide film 5 and the nitride film 6. At this point, by forming the SiGe spacer layer 7a after the formation of the Si buffer layer 7d which will be described in detail later, non-selective growth is reliably performed so that the polycrystalline layer 8 is deposited over the nitride film 6.

Figure 3A:
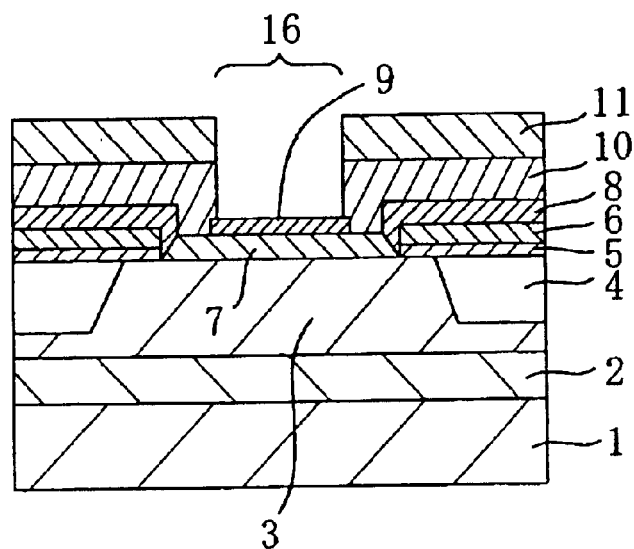
FIGS. 3A thorough 3C are cross-sectional views illustrating the latter half of the process steps of the method for fabricating the SiGe-HBT according to the second embodiment.

Next, in a process step shown in FIG. 3A, an oxide film 9 is deposited to a thickness of 50 nm over the substrate, and then is partially removed through a photolithography technique and an etching technique so that part of the oxide film 9 is left on the center portion of the Si/Ge layer 7.

Thereafter, a polysilicon film 10 is deposited to a thickness of 200 nm over the substrate, and then ions of boron as an impurity are implanted into the polysilicon film 10. Thereafter, an oxide film 11 is deposited on the polysilicon film 10. Then, using a photolithography technique and an etching technique, an emitter opening 16 is formed in the oxide film 11 and the polysilicon film 10.

Figure 3B:
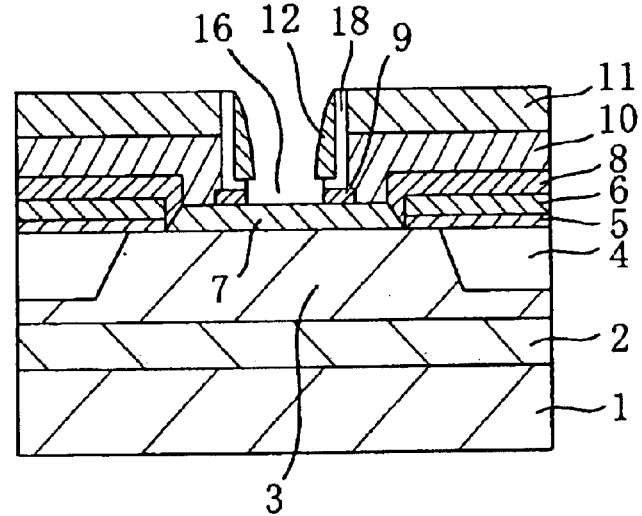

Next, in a process step shown in FIG. 3B, an oxide film and a nitride film are deposited to a thickness of 50 nm and a thickness of 100 nm, respectively, over the substrate, and then anisotropic dry etching is performed to form an oxide film sidewall 18 and a nitride film sidewall 12 on each side wall of the lamination of the oxide film 11 and the polysilicon film 10. Furthermore, the oxide film 9 is wet-etched to remove an exposed part thereof located in a region corresponding to the emitter opening 16.

Figure 3C:
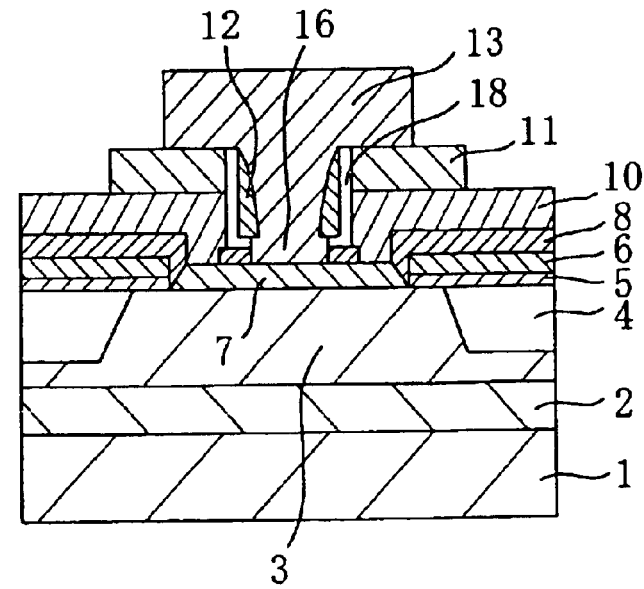

Thereafter, in a process step shown in FIG. 3C, an n-type polysilicon film that is to serve as an emitter electrode is deposited over the substrate. Subsequently, using a photolithography technique and an etching technique, the polysilicon film is patterned to form an emitter polysilicon electrode 13. Thereafter, thermal annealing such as RTA is performed so that an n-type impurity is diffused from the emitter polysilicon electrode 13 into the Si cap layer 7c of the Si/SiGe layer 7, thereby forming an Si emitter region Rem on an SiGe base layer. In this manner, an emitter and base junction is formed.

By following the process steps described above, the SiGe-HBT having an Si-SiGe heterojunction is formed.

Figure 4:
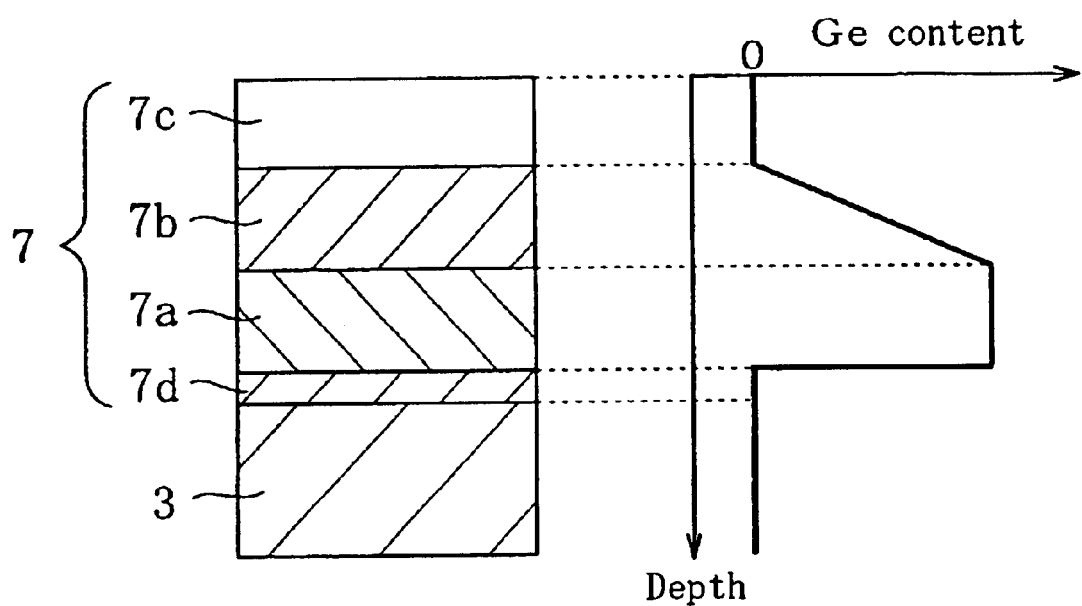
FIG. 4 shows a schematic cross-section of an Si/SiGe layer taken along the line IV—IV shown in FIG. 1 and the profile of the Ge content of the Si/SiGe layer in the depth direction.

FIG. 4 shows a schematic cross-section of an Si/SiGe layer 7 of an SiGe-HBT taken along the line IV—IV shown in FIG. 1 and the profile of the Ge content of the Si/SiGe layer 7 in the depth direction. As shown in FIG. 4, the Si/SiGe layer 7 in the SiGe-HBT of this embodiment includes the Si buffer layer 7d located directly on the N⁻ epitaxial layer 3, the non-doped SiGe spacer layer 7a provided on the Si buffer layer 7d, the graded SiGe layer 7b provided on the SiGe spacer layer 7a, and the Si cap layer 7c provided on the graded SiGe layer 7b. The upper portion of the Si cap layer 7c is doped with an n-type impurity by diffusion to serve as an emitter layer while the lower portion of the cap layer 7c serves as part of a base layer. In the graded SiGe layer 7b, the Ge content decreases gradually in the direction heading from the SiGe spacer layer 7a to the Si cap layer 7c.

One of the structural characteristics of the SiGe-HBT according to the first embodiment of the present invention exhibited here is that the thin Si buffer layer 7d is formed between the N− epitaxial layer 3 serving as a collector layer and the SiGe spacer layer 7a in the Si/SiGe layer 7. As the graph in the right-hand part of FIG. 4 shows, the Ge content of the Si buffer layer 7d is zero. However, even when an SiGe buffer layer with a low Ge content is formed instead of the Si buffer layer 7d, the following effects can be achieved.

Figure 5:
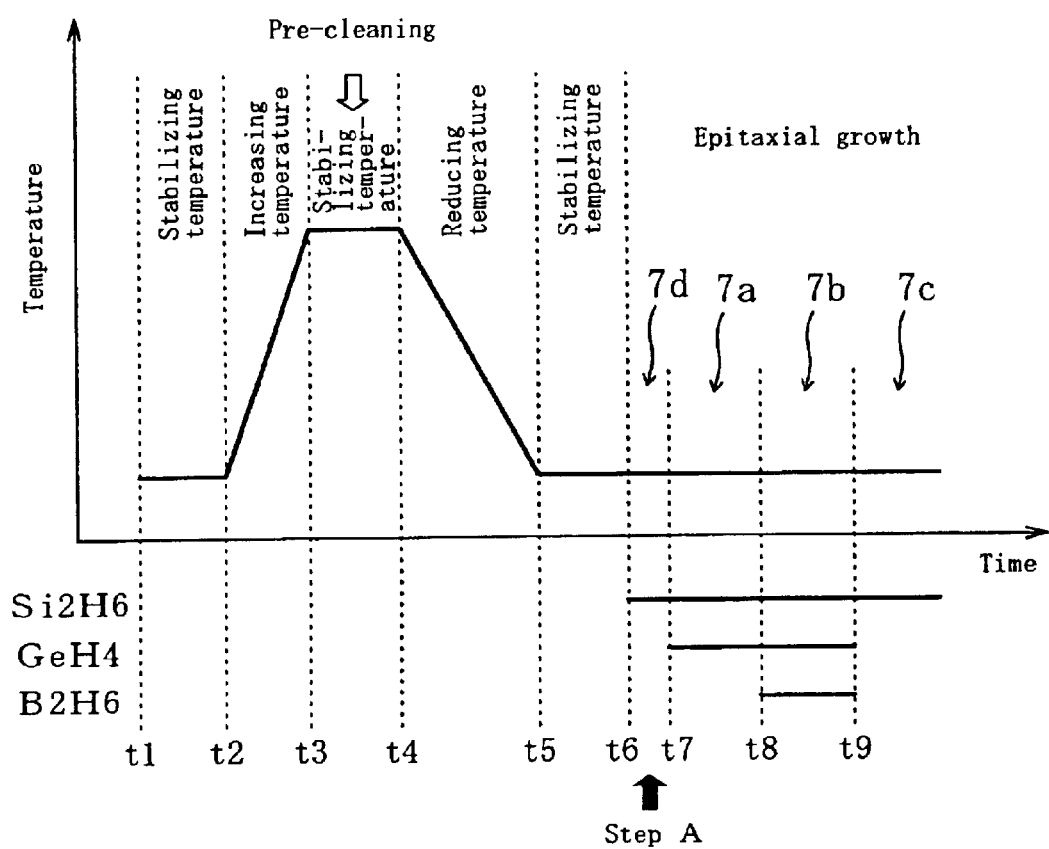
FIG. 5 is a timing chart showing a sequence of standard process steps of SiGe epitaxial growth according to the first embodiment of the present invention.

FIG. 5 is a timing chart showing a sequence of standard process steps of SiGe epitaxial growth according to the first embodiment. Epitaxial growth of an SiGe film using UHV-CVD will be described herein. However, an epitaxial film can be also grown in a similar manner using LP-CVD or MBE.

As shown in FIG. 5, according to the first embodiment, a wafer is loaded into a reaction chamber under ultra-high vacuum (UHV) at a timing t1 and the temperature of the wafer is increased to a high temperature ranging from about 650° C. to 800° C. in a period from a timing t2 to a timing t3. Then, annealing (pre-cleaning) is performed for a period from the timing t3 to a timing t4 (e.g., for about 2 to 20 min.). Specifically, a natural oxide film formed on the upper surface of a silicon substrate is reacted with silicon in the substrate so that SiO having a high vapor pressure is removed (sublimated) therefrom. As a result, a clean Si surface is exposed in a region where epitaxial growth is intended to be performed. The reaction is represented by the following formula:

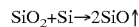

Next, in a period from the timing t4 to a timing t5, the wafer temperature is reduced to a growth temperature ranging from about 500° C. to 650° C., and then the wafer is held to stand for a period from the timing t5 to a timing t6 until the temperature distribution of the wafer surface is uniformalized. Thereafter, each layer is started to be grown by introducing source gases such as disilane, monogermane and diboran into a process chamber at respective predetermined flow rates.

Steps of growing each layer will be described in details. First, for a period from a timing t6 to t7 (in Step A), an Si buffer layer 7d is grown by supplying only disilane (Si$_2$H$_6$) at a constant flow rate. Next, for a period from the timing t7 to a timing t8, disilane and monogerman (GeH$_4$) are supplied to the upper surface of the wafer at respective constant flow rates, thereby growing an SiGe spacer layer 7a. Then, for a period from the timing t8 to a timing t9, a graded SiGe layer 7b is grown by reducing the flow rate of monogerman stepwise under the condition that the flow rates of disilane and diboran (B$_2$H$_6$) are kept constant and thereby grading the Ge content. Furthermore, an Si cap layer 7c is formed by supplying disilane to the upper surface of the wafer at a constant flow rate for a predetermined period of time from the timing t9.

Figure 6:
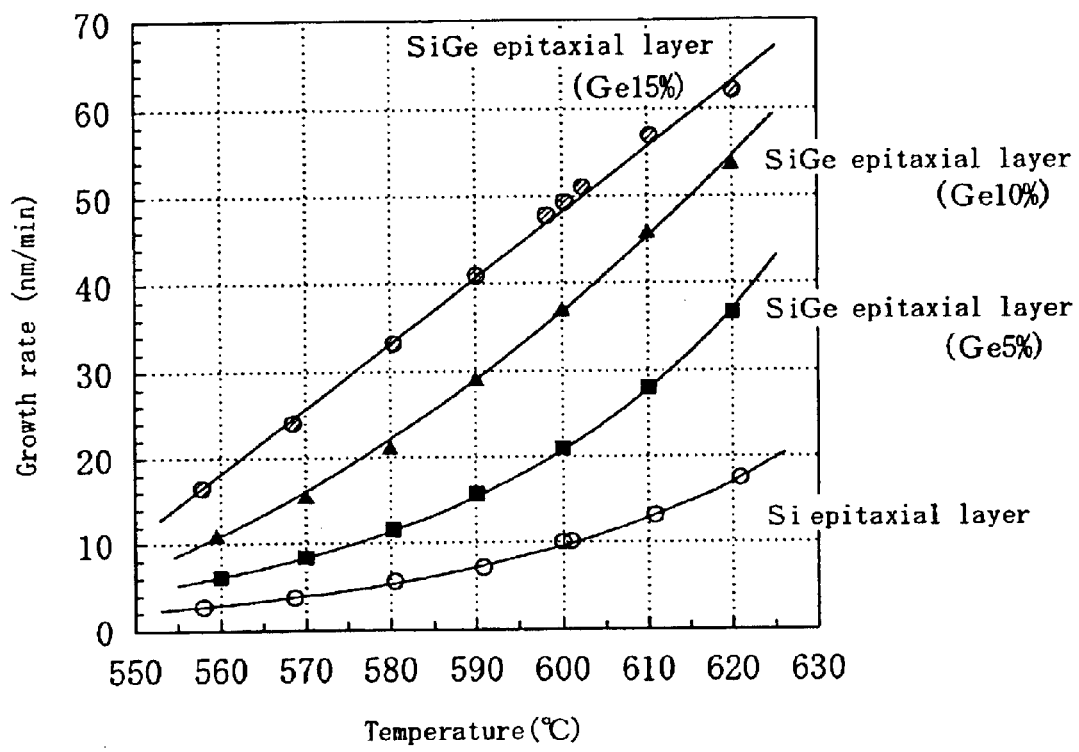
FIG. 6 is a graph comparatively showing the dependency of growth rate on wafer temperature for SiGe epitaxial films and an Si epitaxial film.

FIG. 6 is a graph comparatively showing the dependency of growth rate on wafer temperature for SiGe epitaxial films and an Si epitaxial film. As can be seen from FIG. 6, the growth rate of the Si epitaxial film is smaller than those of the SiGe epitaxial films and therefore, when an Si epitaxial film and an SiGe epitaxial film are intended to be grown to the same thickness, the time during which a source gas is supplied becomes longer in the case of the Si epitaxial films than in the case of the SiGe epitaxial films. Therefore, it is possible to form a sufficient number of growth nuclei having a sufficiently large size on the surface of an insulating film such as the oxide film 5 and the nitride film 6 while growing a relatively thin Si buffer layer 7d. Accordingly, a polycrystalline Si film can be formed on the surface of the insulating layer while the Si buffer layer 7d is epitaxially grown. Even if only growth nuclei have been formed on the surface of the insulating layer while the Si buffer layer 7d is epitaxially grown, a polysilicon SiGe film can be formed on the surface of the insulating layer while the SiGe spacer layer 7a or the graded SiGe layer 7b is epitaxially grown in a subsequent step. Once a polycrystalline layer is formed, a polycrystalline SiGe film is grown, during the subsequent epitaxial growth of a single crystalline SiGe film at about the same growth rate as the single crystalline SiGe film.

However, there may be cases where an energy barrier to electrons is formed at the interface between the SiGe spacer layer 7a and the Si buffer layer 7d because the Si buffer layer 7d whose energy gap is different from that of the SiGe spacer layer 7a is provided. In such a case, the electric properties of the SiGe-HBT, specifically its high-frequency property, may be degraded.

Figure 7:
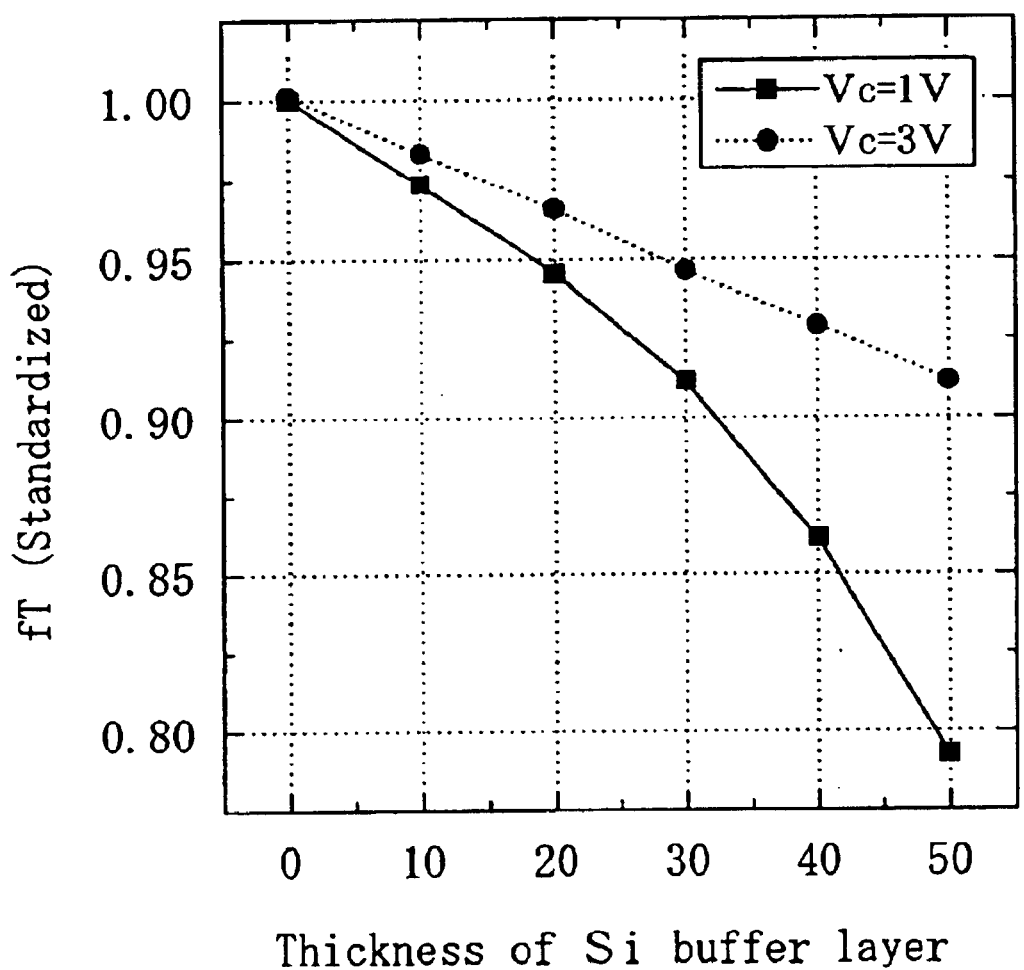
FIG. 7 is a graph showing the results of simulations for the high-frequency property of the SiGe-HBT produced according to the first embodiment.

FIG. 7 is a graph showing the results of simulations for the high-frequency property (maximum cutoff frequency fT) of the SiGe-HBT produced according to the first embodiment of the present invention. In FIG. 7, the maximum cutoff frequency fi is standardized at the value obtained for an SiGe-HBT including no Si buffer layer 7d. The simulations were performed using as parameters the film thickness of the Si buffer layer 7d and the voltage applied between a collector and an emitter.

As shown in FIG. 7, the rate of degradation of the maximum cutoff frequency fT was about 3% when the thickness of the Si buffer layer 7d is 10 nm, and the degradation rate is about 6% even when the thickness of the Si buffer layer 7d is increased to 20 nm. The reason for this is assumed that electrons injected from the emitter are accelerated by a built-in electric field formed in the graded SiGe layer 7b enough to go over the energy barrier formed between the SiGe spacer layer 7a and the Si buffer layer 7b. Furthermore, by increasing the built-in electric field in the graded SiGe layer 7b, i.e., by increasing the Ge content of the SiGe film to obtain a greater gradation of the Ge content in the graded SiGe layer 7b, the degradation rate of the maximum cutoff frequency fT can be reduced to a negligibly low level.

According to FIG. 7, the thickness of the Si buffer layer 7d is preferably within the range from 2 nm to 20 nm.

FIG. 8 is a table showing the differences between measured values for the high-frequency properties (i.e., maximum cutoff frequency fT and maximum oscillation frequency $f_{max}$) of two SiGe-HBT samples, one including the Si buffer layer 7d and the other not, formed according to the present invention. As shown in FIG. 8, the sample including the Si buffer layer 7d has the substantially same values for the high-frequency properties as the sample including no Si buffer layer 7d.

Figure 17A:
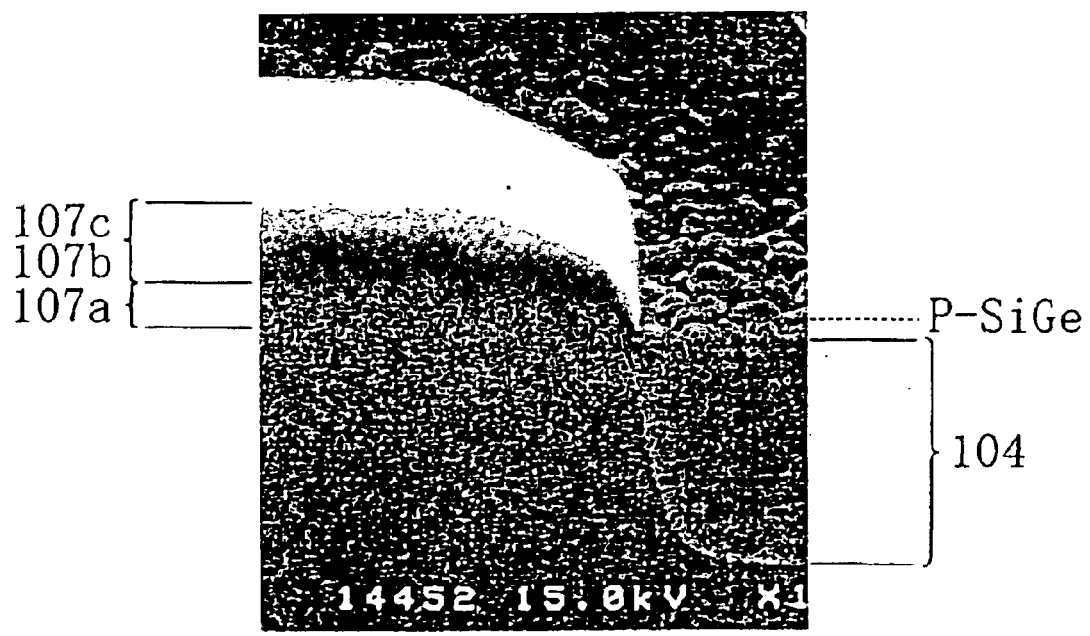
FIGS. 17A and 17B are the respective SEM photos showing cross-sections of SiGe epitaxial films formed by the known non-selective epitaxial technique and by the nonselective epitaxial technique of the present invention, respectively.
Figure 17B:
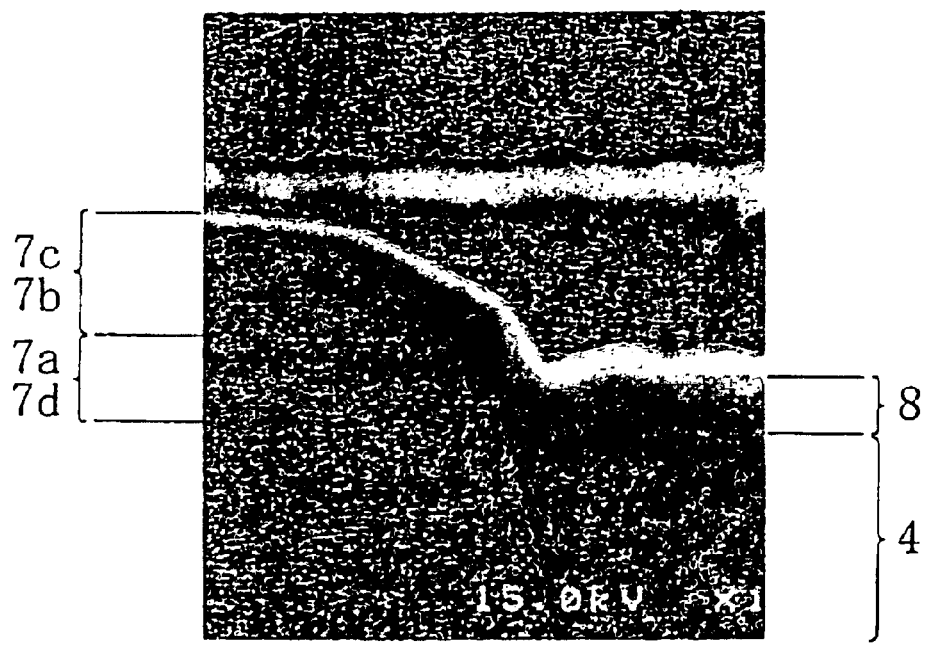
Figure 18:
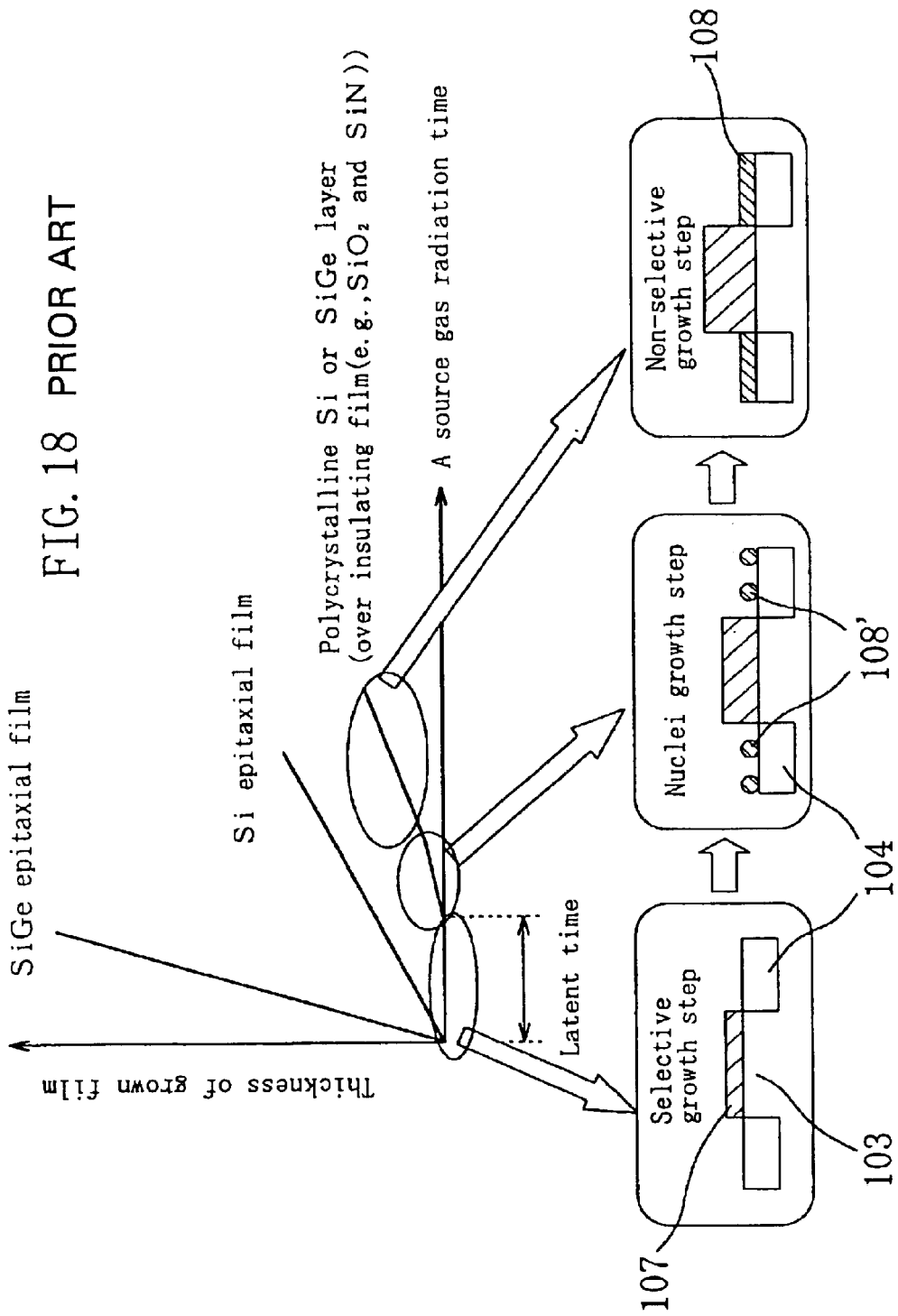
FIG. 18 schematically shows the relation between the thickness of a grown film and the radiation time during which a source gas is supplied for the SiGe epitaxial film, the Si epitaxial film, and the polycrystalline Si and SiGe films on the insulating film.

FIG. 17B is an SEM photo showing a cross-section of an epitaxial SiGe epitaxial film formed by a non-selective epitaxial SiGe epitaxial technique of this embodiment which will be described later. It has been confirmed that basically the same structure as that of FIG. 17A can be formed according to this embodiment. That is to say, the polycrystalline Si/SiGe layer 8 having a sufficient thickness can be formed over the isolation oxide film 4.

According to the first embodiment of the present invention, by providing the Si buffer layer 7d having a thickness of about 10 nm, non-selectivity can be ensured without degrading the high-frequency properties of the SiGe-HBT while epitaxial growth is performed. As a result, the polycrystalline Si/SiGe layer 8 can function as part of the base lead-electrode, resulting in reduction in base resistance.

Now that the latent time is already over, even if a polycrystalline layer is with a thickness of only a few nm or only growth nuclei have been formed on the surface of the insulating film in the process step of forming the Si buffer layer 7d, the object of promoting growth of the polycrystalline layer on the surface of the insulating layer can be satisfactorily achieved in a subsequent process step.

The graded Ge layer 7b has, because of the electrons accelerated by the electric filed, the effect of widening the range of the thickness of the Si buffer layer 7d that does not affect the high-frequency properties, i.e., the effect of extending the margin of device design. However, this structure is not an essential condition in the present invention. That is to say, this invention is also useful for an SiGe-HBT in which the base layer does not have a Ge graded structure but has a profile of the Ge content represented by a so-called "box plot".

Moreover, when an SiGe buffer layer having a lower Ge content than the SiGe spacer layer 7a is provided, instead of the Si buffer layer 7d, under the SiGe spacer layer 7a, the basic effects of the present invention can be also achieved. Also in that case, to grow the SiGe buffer layer with a low Ge content (with a high Si content), i.e., having a smaller epitaxial growth rate than the SiGe spacer layer 7a, the time during which the source gas is applied becomes longer. Therefore, growth nuclei and a polycrystalline SiGe film can be formed on the insulating film while the source gas is supplied. Moreover, where the SiGe buffer layer is provided, a smaller energy barrier is formed at the interface between the SiGe spacer layer 7a and the SiGe buffer layer than at the interface between the Si buffer layer 7d and the SiGe spacer layer 7a. Accordingly, non-selectivity for epitaxial growth can be improved while degradation of the high-frequency properties of the SiGe-HBT can be prevented.

The Si buffer layer 7d plays a role in suppressing strains between the N⁻ epitaxial layer 3 that is a silicon layer and a single SiGe crystalline film, and therefore the critical film thickness at which relaxation of strains occurs is increased. Accordingly, the advantage of increasing the Ge content of the base layer without harmful effects as well as the effect of improving non-selectivity for epitaxial growth can be achieved.

(Second Embodiment)

A second embodiment of the present invention relates to a method for promoting formation of a polycrystalline layer on the surface of an insulating film by further increasing the time which it takes to form an Si buffer layer 7d having a certain thickness on an Si surface, compared to the first embodiment, and thereby further increasing non-selectivity for epitaxial growth.

Figure 9:
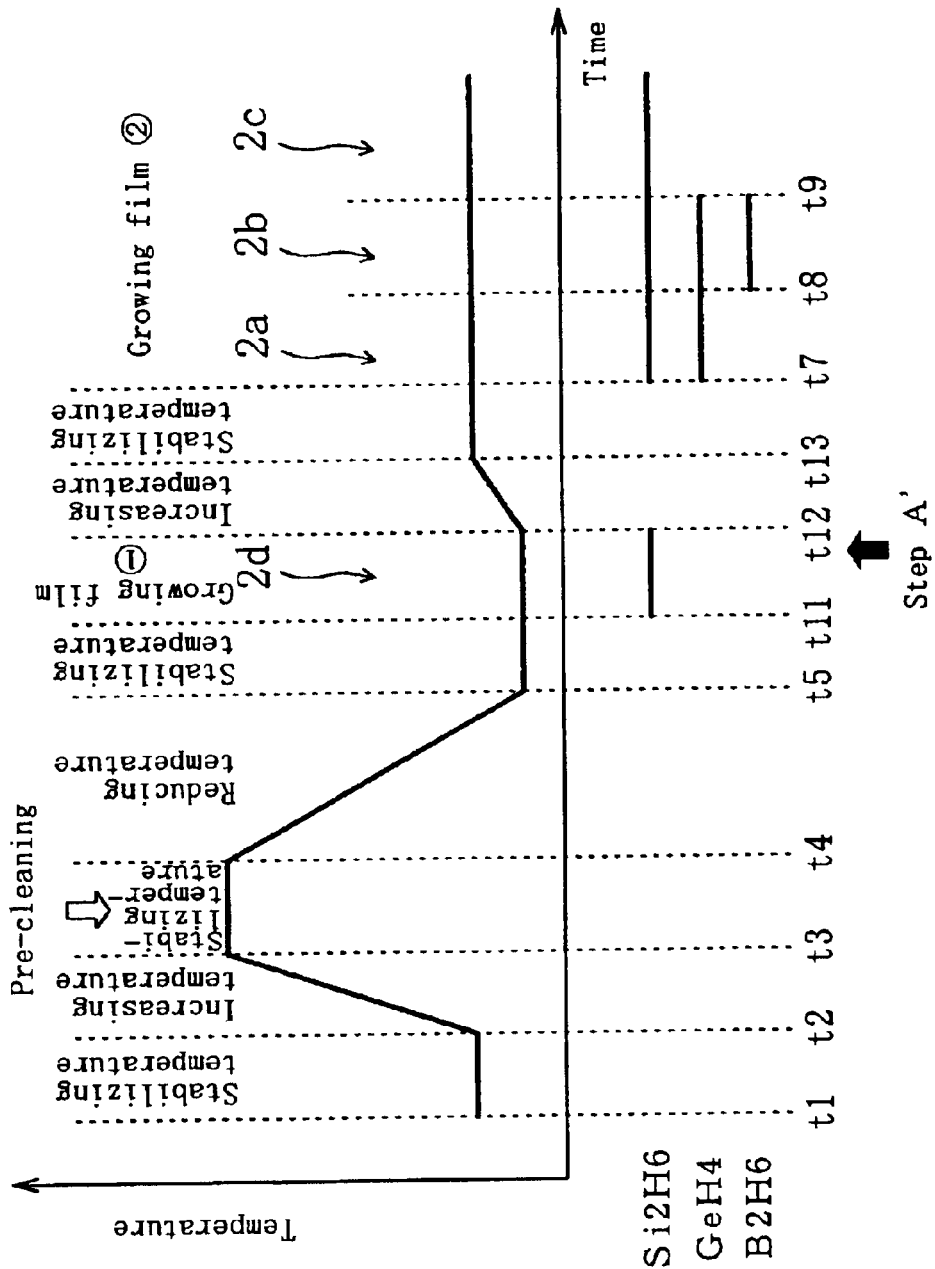
FIG. 9 is a timing chart showing a sequence of standard process steps of SiGe epitaxial growth according to the second embodiment.

FIG. 9 is a timing chart showing a sequence of standard process steps of SiGe epitaxial growth according to this embodiment. Epitaxial growth of an SiGe film using UHV-CVD will be described herein. However, an epitaxial film can be also grown in a similar manner using LP-CVD or MBE.

As shown in FIG. 9, also according to the second embodiment of the present invention, a wafer is loaded into a reaction chamber at a timing t1 and then the temperature of the wafer is increased for a period from a timing t2 to a timing t3. Thereafter, annealing (pre-cleaning) is performed for a period from the timing t3 to a timing t4 and finally the wafer temperature is reduced for a period from the timing t4 to a timing t5. These process steps are almost the same as those in the first embodiment. However, the wafer temperature at the timing t5 is different from that in the first embodiment. The subsequent process steps of: growing an SiGe spacer layer 7a for a period from the timing t7 to a timing t8; growing a graded SiGe layer 7b for a period from the timing t8 to a timing t9; and growing an Si cap layer 7c for a predetermined period of time from the timing t9 are performed in the same manner as in the first embodiment.

The second embodiment is characterized in that the wafer temperature at which the Si buffer layer 7d is grown is reduced to a lower level than the temperature at which the SiGe spacer 7a, the graded SiGe layer 7b and the Si cap layer 7c are grown.

That is to say, as shown in FIG. 9, according to this embodiment, the wafer temperature is further reduced to a lower level than the wafer temperature in the same process step according to the first embodiment at the timing t5, and then the wafer is held to stand until the temperature thereof is stabilized. Then, disilane ($Si_2H_6$) is supplied at a predetermined flow rate for a period from a timing t11 to a timing t12, thereby forming the Si buffer layer 7d (Step A'). Thereafter, the wafer temperature is increased for a period from the timing t12 and a timing t13, and the wafer temperature is stabilized for a period from the timing t13 to the timing t7 and then subsequent process steps are performed.

Effects achieved by reducing the wafer temperature (growth temperature) in Step A' will be described.

Figure 10:
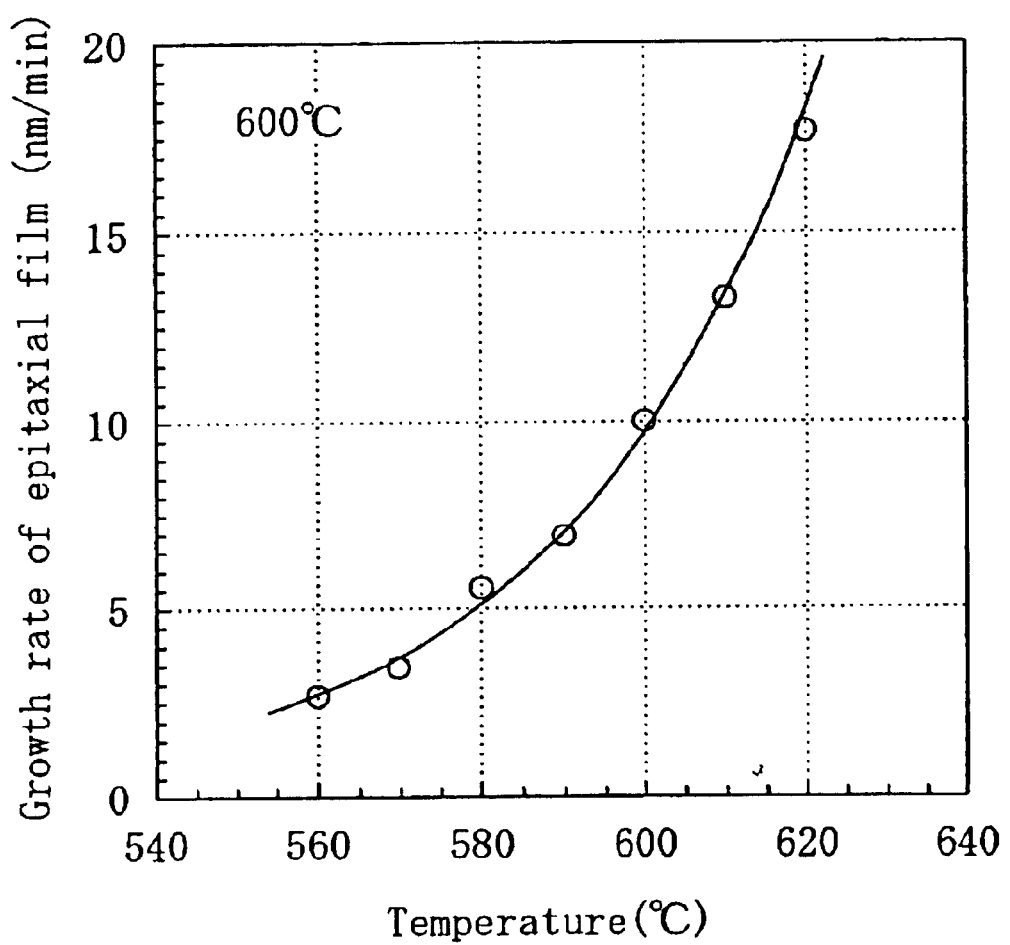
FIG. 10 is a graph showing the dependency of growth rate on wafer temperature for the Si epitaxial film.

FIG. 10 is a graph showing the dependency of growth rate on wafer temperature for the Si epitaxial film. As shown in FIG. 10, assuming that the growth rate at a wafer temperature of 600° C. is the standard rate, a reduction in the wafer temperature by about 20° C. (to 580° C.) reduces the epitaxial growth rate by half, and a reduction in the wafer temperature by 40° C. (to 560° C.) reduces the growth rate to one fourth. This shows that the growth rate of an epitaxial film is sensitive to changes of the wafer temperature. Accordingly, even when the Si buffer layer 7d is intended to be grown to a certain thickness, the growth rate of the Si buffer layer 7d can be reduced by reducing the growth temperature. Moreover, the reduction in the growth rate of the Si buffer layer 7d can extend the time taken to supply the source gas in Step A', and therefore a sufficient number of growth nuclei or a polycrystalline layer can be formed on the surface of the insulating layer during the gas supplying time. Accordingly, a polycrystalline layer having a relatively great thickness can be formed on the surface of the insulating layer when the SiGe spacer layer 7a, the graded SiGe layer 7b and the Si cap layer 7c are formed in subsequent process steps.

When the wafer temperature is reduced by about 20° C., a holding time is required for stabilization of the wafer temperature before and after the temperature reduction. However, the stabilization requires only a short period of time and thus such a significant reduction in throughput as to result in disadvantages in practical applications is not caused.

If the wafer temperature is returned to its original level following the formation of the Si buffer layer 7d and then the SiGe spacer layer 7a and the graded SiGe layer 7b are grown, an increase in processing time can be prevented.

Furthermore, in the case where the Si buffer layer 7d is epitaxially grown at a low temperature, even when the Si buffer layer 7d is intended to be grown to the same thickness as that in the case where epitaxial growth is performed at a normal temperature, the time taken to supply the source gas becomes longer. Therefore, a slow decomposition reaction occurs on the surface of the insulating film. As a result, nuclei are formed relatively evenly on the surface of the insulating film, thus achieving a polycrystalline layer having a fine surface morphology.

In this embodiment, the description has been made assuming the standard temperature of epitaxial growth is to be 600° C. However, this is not an essential condition in the present invention. Specifically, even under condition where the standard temperature of epitaxial growth is not 600° C., the same effects can be achieved as those of this embodiment if the growth temperature of the Si buffer layer 7d is reduced to a low temperature relative to that of the single crystalline SiGe film and thus the gas supplying time becomes longer.

More specifically, the wafer temperature is preferably within the range from 400° C. to 650° C. when epitaxial growth is performed.

Furthermore, under the conditions for epitaxial growth according to this embodiment, a polycrystalline layer having a sufficiently great thickness can be formed on the insulating layer when the epitaxial growth temperature is reduced by about 20° C. However, this extent of temperature reduction of about 20 degree is not essential for the present invention. Specifically, by properly setting the extent of the temperature reduction according to conditions for epitaxial growth and the base structure of a target SiGe-HBT, the same effects as those of the present embodiment can be achieved.

However, as can be seen from FIG. 10, to ensure the effects of the present invention, the extent of the reduction in the wafer temperature preferably ranges from 10° C. to 100° C.

As has been described, by reducing only the growth temperature of the Si buffer layer 7d to a lower level than its original level, non-selectivity for SiGe epitaxial growth can be increased without reducing throughput. Accordingly, a polycrystalline layer having a fine surface morphology and a desired thickness can be formed on the surface of the insulating film.

Also in this embodiment, the graded Ge layer 7b has, because of the electrons accelerated by the electric filed, the effect of widening the range of the thickness of the Si buffer layer 7d that does not affect the high-frequency properties, i.e., the effect of extending the margin of device design. However, this structure is not an essential condition in the present invention. In other words, this invention is useful for an SiGe-HBT in which the base layer does not have a Ge graded structure but has a profile of the Ge content represented by a so-called "box plot".

Moreover, also in this embodiment, if an SiGe buffer layer having a lower Ge content than the SiGe spacer layer 7a is provided, instead of the Si buffer layer 7d, under the SiGe spacer layer 7a, the basic effects according to the present invention can be achieved.

Furthermore, even if the Si buffer layer 7d is not provided, the effect of improving non-selectivity for epitaxial growth while suppressing the increase in throughput to the minimum level can be also achieved by reducing the growth temperature to a lower level than its original temperature in the process step of forming the SiGe spacer layer 7a or part thereof (Third Embodiment)

A third embodiment of the present invention relates to a method for promoting formation of a polycrystalline layer on the surface of an insulating film by promoting formation of the critical nuclei on the surface of the insulating film to further improve non-selectivity for epitaxial growth without affecting the thickness of an Si buffer layer 7d and the time taken to grow it, under the constraint that the Si buffer layer 7d is epitaxially grown to a certain thickness.

Figure 11:
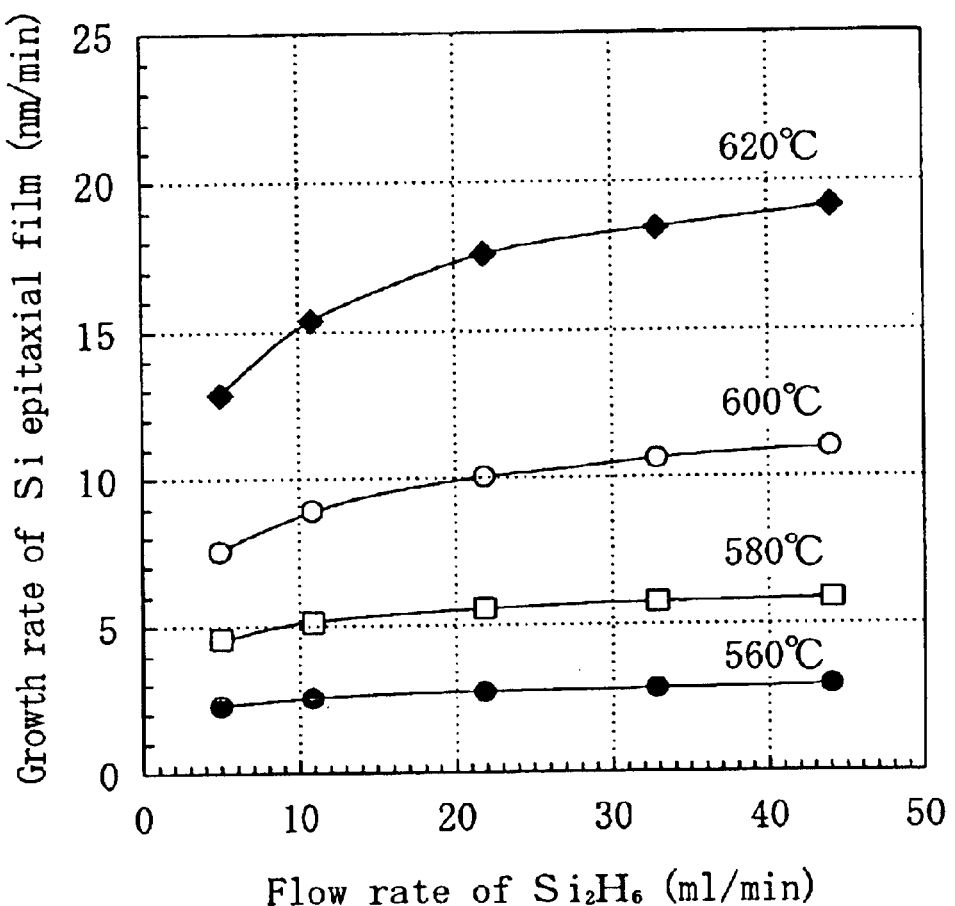
FIG. 11 is a graph showing the dependency of the growth rate of Si epitaxial films on the flow rate of a source gas using growth temperature as a parameter.

FIG. 11 is a graph showing the dependency of the growth rate of Si epitaxial films on the flow rate of a source gas (disilane) using growth temperature as a parameter. FIG. 11 shows that the dependency of the growth rate of the Si epitaxial films on the flow rate of a source gas decreases with decreasing growth temperature. This means that in a region of a wafer which has a low temperature, epitaxial growth is performed under the condition where the reaction rate in the growth is determined. That is to say, the flow rate of the source gas has only negligibly small effects on the growth rate under the condition.

On the other hand, if the flow rate of the source gas is increased, the number of molecules of the source gas supplied to the surface of the insulating film is increased to promote nuclei formation. As a result, a polycrystalline layer is easily formed on the surface of the insulating film. That is to say, the promotion of nuclei formation on the surface of the insulating film can shorten the latent time that is a time lag between the start of supply of the source gas and the start of growth of the polycrystalline layer, and thus a polycrystalline layer having a great thickness can be formed on the surface of the insulating film according the length of the shortened time even if the time which it takes to epitaxially grow the Si buffer layer 7d does not change.

According to this embodiment, using the above-described phenomenon, the Si buffer layer 7d, the SiGe spacer layer 7a, the graded SiGe layer 7b and the Si cap layer 7c are grown in the same manner as in the first embodiment by following the sequence of the process steps shown in FIG. 5. However, the flow rate of the source gas (disilane) used in Step A shown in FIG. 5, i.e., the flow rate of the source gas used when the Si buffer layer is formed is increased to a higher level than that in the first embodiment.

According to this embodiment, when the Si buffer layer 7d is grown (Step A), the dependency of its growth rate on the flow rate of the source gas (disilane) is small. Therefore, nuclei formation can be promoted on the surface of the insulating layer by increasing the flow rate of the source gas while the time taken to supply the source gas is kept substantially unchanged even under the constraint that the Si buffer layer 7d has to have a certain thickness. Accordingly, non-selectivity for SiGe epitaxial growth can be further improved.

In this case, the flow rate of the source gas in the process step of forming the Si buffer layer 7d is preferably as high as possible.

Assume that an SiGe epitaxial film is grown at the increased flow rate of disilane in the sequence shown in FIG. 5. The increased flow rate of disilane involves an increase in the flow rate of germane because the Ge content of a single crystalline SiGe film is determined by the ratio of the flow rate of one source gas (disilane) to the flow rate of the other source gas (germane). As a result, a mass flow controller might have to be unwantedly replaced with another one of proper size for the flow rate used or other necessary processes may be added. Therefore, the flow rate of disilane is preferably returned to the same level as that in the first embodiment when an SiGe film is formed.

If the total amount of source gases used is increased, the production cost is generally increased. However, when a method is used in which the flow rate of disilane is increased only during the growth of the Si buffer layer 7d (Step A) as in this embodiment, the increase in the production cost does not occur Moreover, in the growth of the Si buffer layer 7d, a method in which the growth rate is reduced as in the second embodiment may be combined with a method in which the flow rate of the source gas is increased as in the third embodiment. This further improves non-selectivity for SiGe epitaxial growth as compared to the case of separately using each method.

FIG. 17B is an SEM photo showing a cross-section of an SiGe epitaxial film formed by a non-selective epitaxial technique which is a combination of the second and third embodiments. In a sample used for analysis of the cross-sectional structure, however, the formation of the oxide film 5 and the nitride film 6 shown in FIG. 1 were omitted. The photo of FIG. 17B was taken using the sample including a 10 nm thick Si buffer layer 7d, a 40 nm thick SiGe spacer layer 7a with a 15% Ge content, a 40 nm thick graded SiGe layer 7b in which the Ge content is graded from 15% to 0% and a 30 nm thick Si cap layer 7c. In this case, the flow rate of disilane is doubled as compared to the known fabrication method and the thickness of the Si buffer layer 7d is reduced to 10 nm (the growth rate is reduced by 20° C. only in forming the Si buffer layer 7d).

As shown in FIG. 17B, an Si/SiGe layer 7 exists on an N⁻ collector layer 3, and a polycrystalline Si/SiGe film 8 having a sufficient thickness is formed on an isolation oxide film 4. That is to say, as compared to one formed by the known method (see FIG. 17A), a polycrystalline layer having a great thickness and a fine surface morphology is formed on the isolation oxide film that serves as an insulating layer. Moreover, FIG. 17B shows that the epitaxial film has a shape equivalent to that of one formed by the known method (see FIG. 17A).

(Fourth Embodiment)

A fourth embodiment of the present invention relates to a method for effectively utilizing high temperature annealing (pre-cleaning) performed to remove a natural oxide film before epitaxial growth is performed. More specifically, the fourth embodiment relates to a method in which a source gas is supplied for a short time during or after pre-cleaning or in reducing the wafer temperature after pre-cleaning, thereby forming a certain density of growth nuclei having the same size as or a larger size than the critical nuclei on the surface of an insulating film. Accordingly, non-selectivity for epitaxial growth is further increased, thus promoting the formation of a polycrystalline layer on the surface of the insulating layer.

Growth nuclei are normally formed through process steps such as decomposition, electrophoresis and association of reaction species on the surface of the insulating layer. When the growth temperature is increased, decomposition reaction becomes particularly active in the process steps, thereby promoting the nuclei formation. However, if the growth temperature is simply increased, the growth rate of an epitaxial layer on the surface of a silicon layer is increased as well. Thus, the time which it takes to grow the epitaxial layer has to be shorter under the condition that the epitaxial layer has to have a certain thickness. As a result, nuclei formation is suppressed by contraries.

Figure 12:
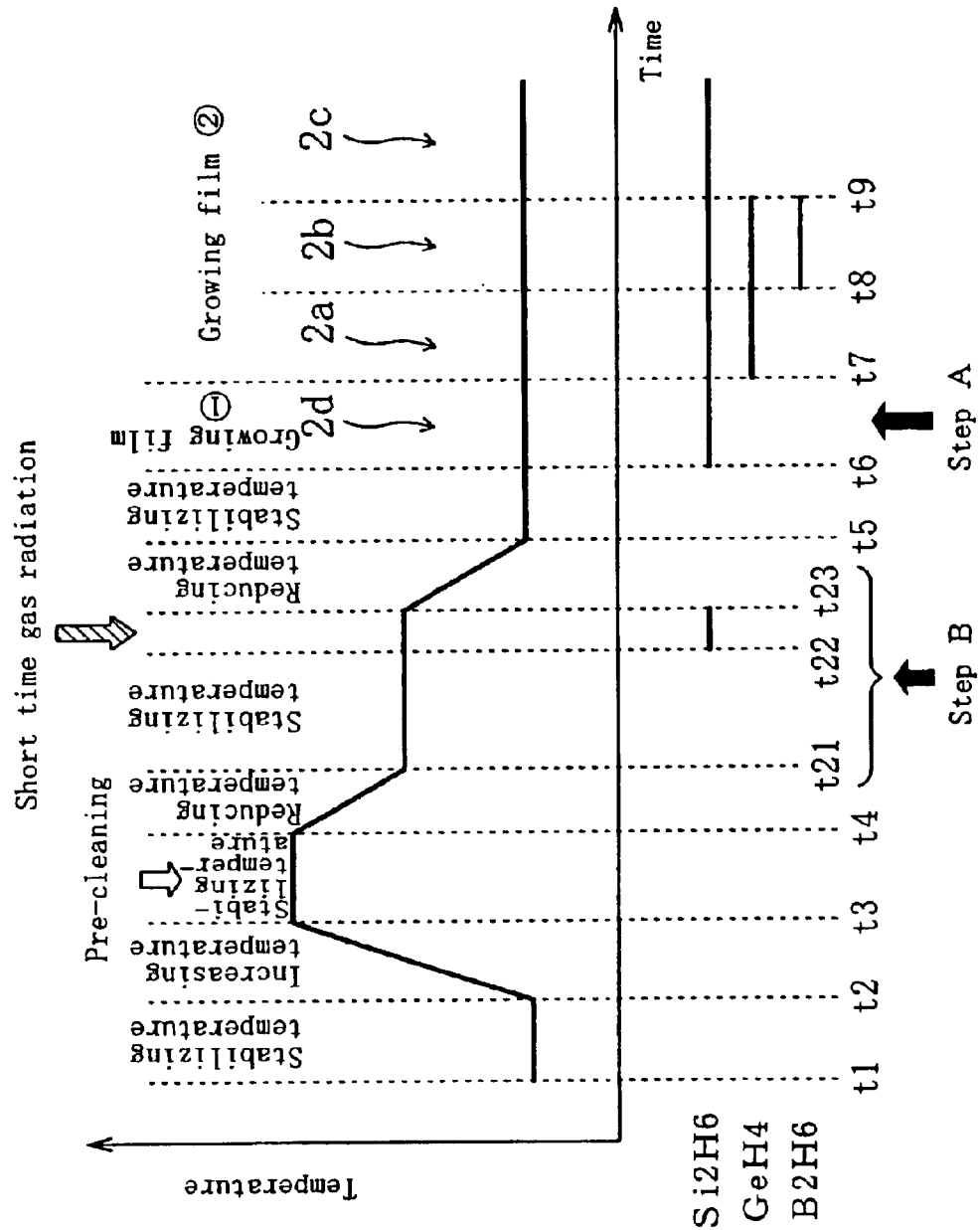
FIG. 12 is a timing chart showing a sequence of standard process steps for SiGe epitaxial growth according to a first example of the fourth embodiment of the present invention.

As has been described, where an SiGe epitaxial film is used as a base layer of an SiGe-HBT, there is the constraint that the epitaxial film has to have a certain thickness. Because of this constraint, it is difficult to simultaneously achieve both of maintenance of a sufficiently long time to grow nuclei and promotion of nuclei formation by the increase in the growth temperature. However, according to this embodiment, to overcome the difficulty, the step of forming nuclei, Step B, is performed before a buffer layer is formed. That is to say, this embodiment is characterized in that the wafer temperature is once stabilized in the step of reducing the wafer temperature after pre-cleaning, a source gas (disilane) is supplied for a short time, the wafer temperature is again reduced to the epitaxial growth temperature, and then epitaxial growth is performed. There are two possible timings at which Step B is inserted, as will be described, FIG. 12 is a timing chart showing a sequence of standard process steps for SiGe epitaxial growth according to the first example of this embodiment, wherein Step B is inserted into the sequence of the process steps according to the first embodiment (see FIG. 5). Epitaxial growth of an SiGe film using UHV-CVD will be described herein. However, an epitaxial film can be also grown in a similar manner using LP-CVD or MBE.

As shown in FIG. 12, a wafer is loaded into a reaction chamber at a timing t1 and then the temperature of the wafer is increased for a period from a timing t2 to a timing t3. Thereafter, annealing (pre-cleaning) is performed for a period from the timing t3 to a timing t4 and then the wafer temperature is reduced in a period from the timing t4 to a timing t5. These process steps are almost the same as those in the first embodiment. In this case, however, Step B is performed within the period from the timing t4 to the timing t5. Furthermore, the process steps of: stabilizing the wafer temperature for a period from the timing t5 to a timing t6; epitaxially growing an Si buffer layer 7d for a period from the timing t6 to a timing t7 (Step A); growing an SiGe spacer layer 7a for a period from the timing t7 to a timing t8; growing a graded SiGe layer 7b for a period from the timing t8 to a timing t9; and growing an Si cap layer 7c for a predetermined period of time from the timing t9 are performed in the same manner as in the first embodiment.

Then, as shown in FIG. 12, according to this example, the reduction of the wafer temperature is stopped at a higher temperature than that in the first embodiment at the timing t21, and then the wafer is held to stand for a period from the timing t21 to a timing t22 until the temperature thereof is stabilized. Thereafter, disilane ($Si_2H_6$) is supplied at a predetermined flow rate for a short time from the timing t22 to a timing t23. The time taken to perform Step B should be as short as the time taken to form growth nuclei. Thereafter, the wafer temperature is reduced for a period from the timing t23 to the timing t5, and then subsequent process steps are performed.

Figure 13:
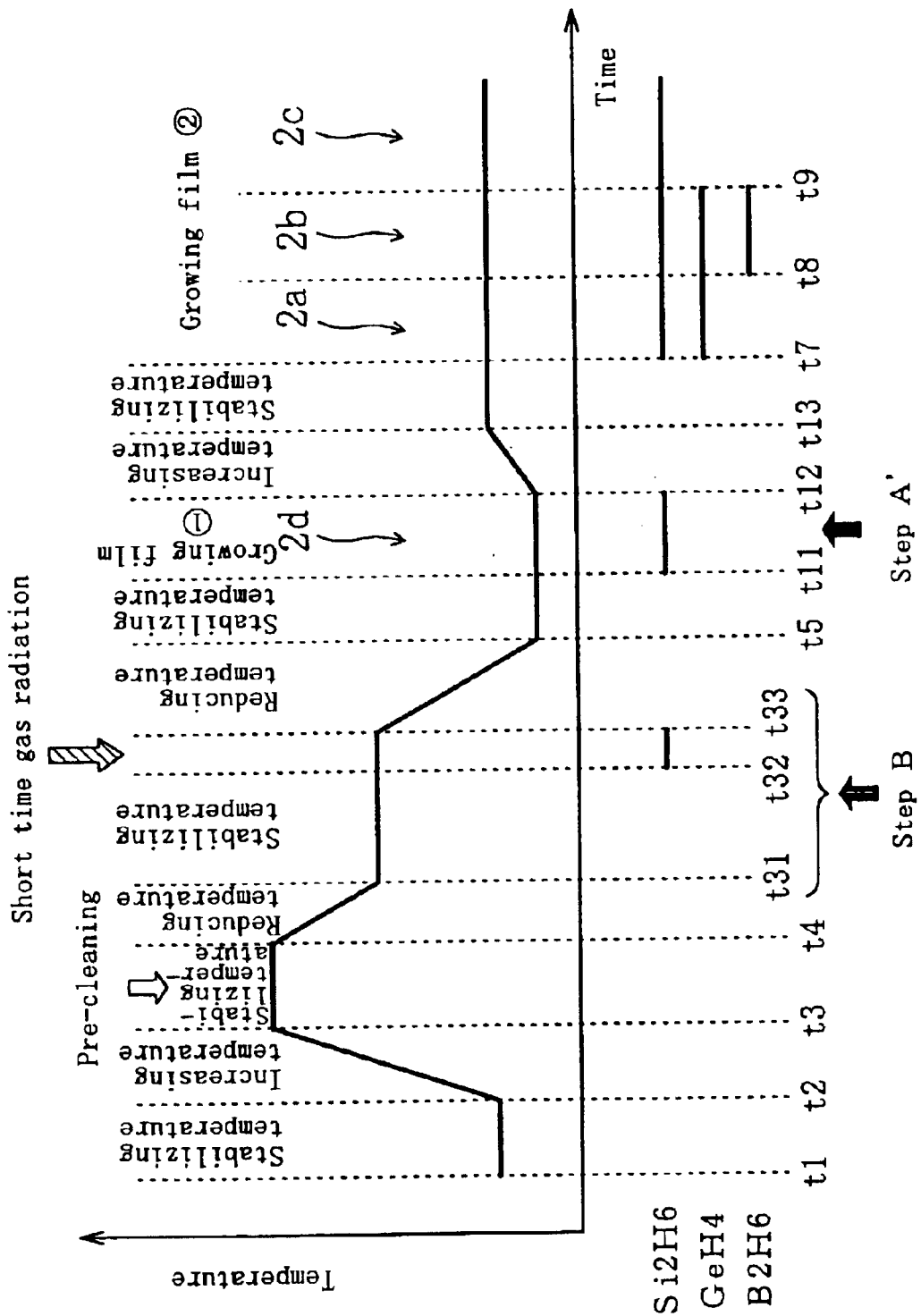
FIG. 13 is a timing chart showing a sequence of standard process steps for SiGe epitaxial growth according to a second example of the fourth embodiment.
Figure 14A:
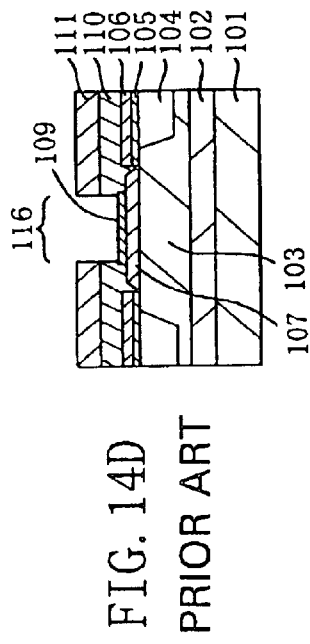
FIGS. 14A through 14F are cross-sectional views illustrating a typical method for fabricating SiGe-HBTs using the known selective SiGe epitaxial growth technique.
Figure 14B:
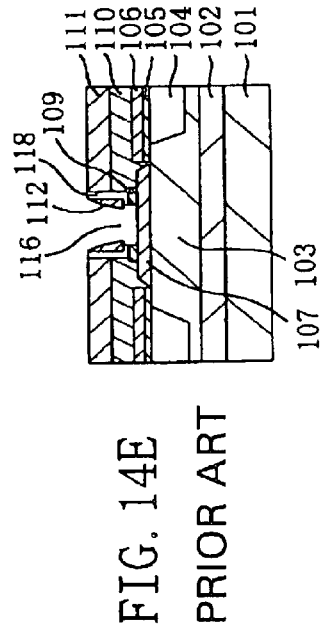
Figure 14C:
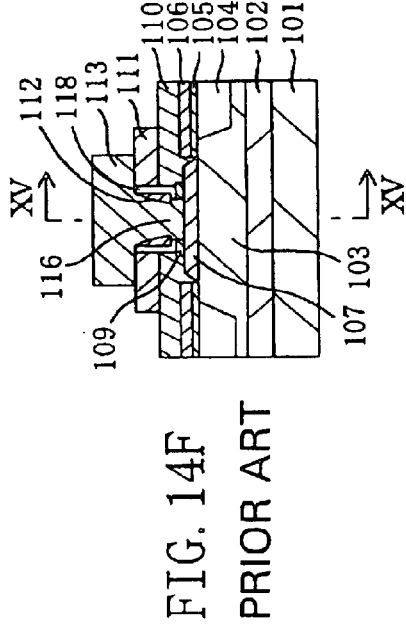
Figure 14D:
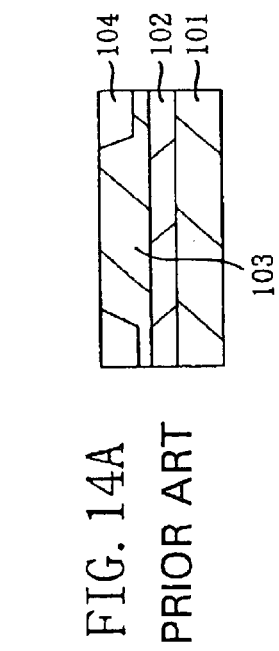
Figure 14E:
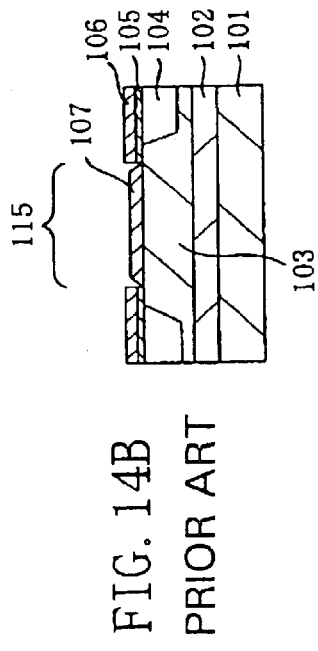
Figure 14F:
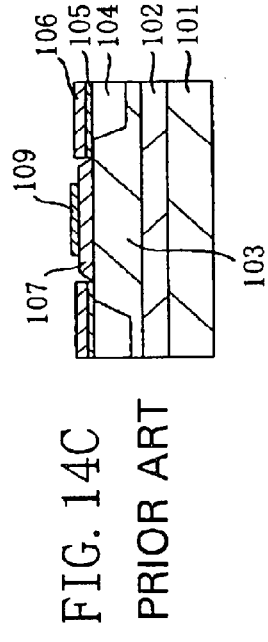
Figure 15:
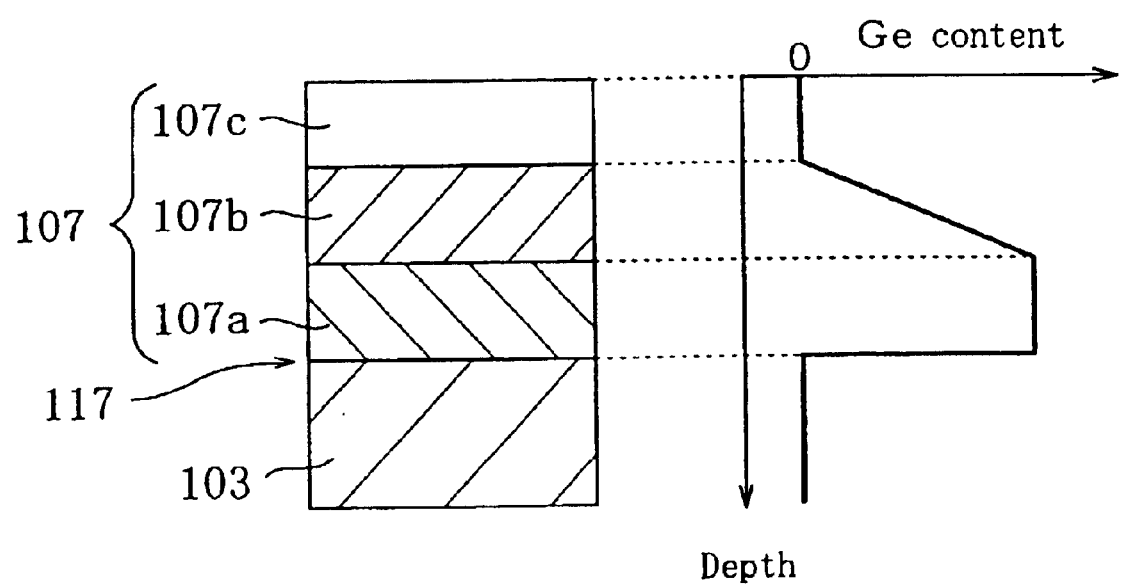
FIG. 15 shows a schematic cross-section of an Si/SiGe layer 107 of an SiGe-HBT taken along the line XV—XV shown in FIG. 14F and the profile of the Ge content of the Si/SiGe layer 107 in the depth direction
Figure 16:
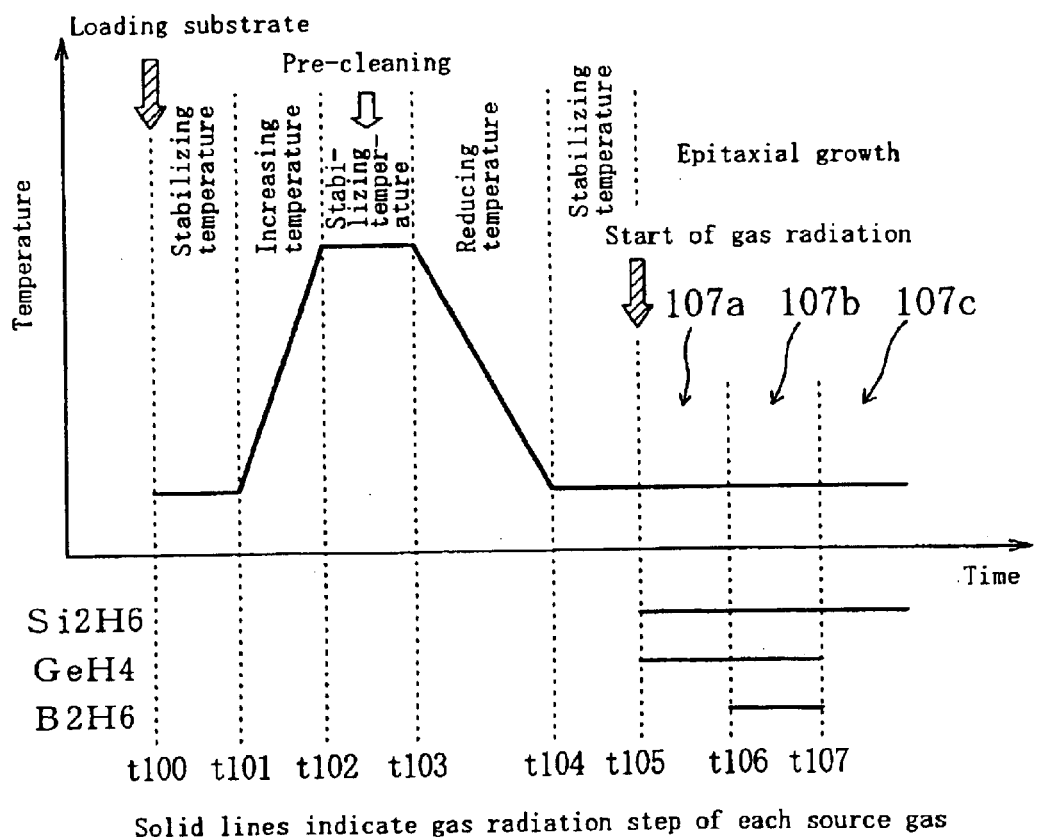
FIG. 16 is a timing chart showing the sequence of the standard process steps of the known SiGe epitaxial growth.

FIG. 13 is a timing chart showing a sequence of standard process steps for SiGe epitaxial growth according to the second example of this embodiment, wherein Step B is inserted into the sequence of the process steps according to the second embodiment (see FIG. 9). Epitaxial growth of an SiGe film using UHV-CVD will be described herein. However, an epitaxial film can be also grown in a similar manner using LP-CVD or MBE.

As shown in FIG. 13, a wafer is loaded into a reaction chamber at a timing t1 and then the temperature of the wafer is increased for a period from a timing t2 to a timing t3. Thereafter, annealing (pre-cleaning) is performed for a period from the timing t3 to a timing t4 and then the wafer temperature is reduced in a period from the timing t4 to a timing t5. These process steps are almost the same as those in the first embodiment. Furthermore, the process steps: of growing an SiGe spacer layer 7a for a period from a timing t7 to a timing t8; growing a graded SiGe layer 7b for a period from the timing t8 to a timing t9; and growing an Si cap layer 7c for a predetermined period of time from the timing t9 are also performed in the same manner as in the first embodiment. Moreover, the wafer temperature is reduced to a lower level than that in the first embodiment at the timing t5, and then the wafer is held to stand until the temperature thereof is stabilized. Thereafter, disilane ($Si_2H_6$) is supplied at a predetermined flow rate for a period from a timing t11 to a timing 12, thereby forming the Si buffer layer 7d (Step A'). Then, in the same manner as in the second embodiment, the wafer temperature is increased for a period from the timing t12 to a timing t13, the wafer temperature is stabilized for a period from the timing t13 to the timing t7, and then subsequent steps are performed.

As shown in FIG. 13, in this example, the reduction of the wafer temperature is stopped at a higher temperature than that in the first embodiment at the timing t31, the wafer is held to stand for a period from the timing t31 to a timing t32 until the temperature thereof is stabilized, and then disilane ($Si_2H_6$) is supplied at a predetermined flow rate for a short time from a timing t32 to a timing t33 (Step B). The time taken to perform Step B should be as short as the time taken to grow nuclei formation. Then, the wafer temperature is decreased for a period from the timing t33 to the timing t5 and then subsequent process steps are performed.

As has been described, if the source gas (disilane) is supplied at a relatively high temperature at a time point during the reduction of the wafer temperature after pre-cleaning, nuclei can be actively formed on the surface of the insulating layer. During the nuclei formation, the source gas is supplied for only a short time and thus epitaxial growth on the surface of the silicon layer can be suppressed. Accordingly, the epitaxial film is grown to only a small thickness. In this manner, by supplying a source gas for a short time after pre-cleaning has been performed and growing the Si buffer layer 7d at a low temperature and at a further increased flow rate, non-selectivity for epitaxial growth can be further improved as compared to the case of separately using each process step of the known fabrication method.

In this example, after pre-cleaning has been preformed, the wafer temperature is once reduced, the wafer temperature then is stabilized, and finally disilane is supplied (see Step B of FIGS. 12 and 13). However, disilane may be supplied after the natural oxide film has been removed by pre-cleaning and before the temperature reduction is started.

Alternatively, because the gas is supplied only for a short time after pre-cleaning, the stabilization process performed before the gas supply may be omitted and the gas may be supplied while the wafer temperature is reduced.

Furthermore, in this example, disilane is supplied for a short time, thereby forming nuclei. However, even if disilane and germane are supplied or only germane is supplied, nuclei can be also formed.

In the structure of the SiGe-HBT of the present invention, other regions than the epitaxial growth region are covered with the nitride film. However, the regions may be covered with an insulating film other than a nitride film. In particular, when an oxide insulating film is used for covering, nuclei formation on the oxide film takes place as a competitive reaction to a decomposition reaction of the oxide film ($SiO_2+Si \rightarrow 2SiO\uparrow$). However, if fabrication conditions such as a wafer temperature, a time taken to supply a source gas and the flow rate of the gas are properly selected for each time, the nuclei formation preferentially occurs.

The present invention is not limited to the above-described first through fourth embodiments. Even if, for example, a ternary system mixed semiconductor layer ($Si_{1-x-y}Ge_xC_y$ layer) containing Si, Ge and C (carbon) is used as a base layer instead of a binary system mixed semiconductor layer containing Si and Ge, the same effects can be also achieved. Furthermore, even if the present invention is applied to an HBT including a compound semiconductor layer containing indium (In), gallium (Ga) and P instead of an HBT including a mixed semiconductor layer, the same effects can be also achieved.

Moreover, the application of the present invention is not limited to the case where an underlying layer (which is the collector layer in this embodiment) on which a base layer or the like is formed is a silicon layer. Even if the present invention is applied to the case where the underlying layer is an SiGe layer or an SiGeC layer, the almost same effects can be also achieved.

Furthermore, although in each of the foregoing embodiments, the case where the polycrystalline layer 8 located on the insulating layer functions as a base lead-electrode of a bipolar transistor has been described, the present invention is not limited to the embodiments. For example, the polycrystalline layer 8 can be used as, for example, a gate electrode or a part thereof in an MIS transistor of a BiCMOS. In that case, by utilizing reduced resistance of the polycrystalline SiGe film or the polycrystalline SiGeC film, BiCMOS including an MIS transistor with a great driving force can be achieved.

What is claimed is:

1. A method for fabricating a semiconductor device, comprising the steps of:

(a) pre-cleaning a substrate including a single crystalline underlying layer having a composition represented by $Si_{1-x3-y3}Ge_{x3}C_{y3}$ (where $0 \leq x3 < 1$, $0 \leq y3 < 1$) and an insulating layer;

(b) forming, after the step (a), a buffer layer having a composition represented by $Si_{1-x2-y2}Ge_{x2}C_{y2}$ (where $0 \leq x2 < 1$, $0 \leq y2 < 1$) on the underlying layer while depositing a first polycrystalline semiconductor layer having substantially the same composition as the buffer layer on the insulating layer; and (c) forming, after the step (b), a semiconductor layer having a composition represented by $Si_{1-x1-y1}Ge_{x1}C_{y1}$ (where $0 < x1 < 1$, $0 \leq y1 < 1$) on the buffer layer while depositing over the insulating layer a second polycrystalline semiconductor layer having substantially the same composition as the semiconductor layer so that the second polycrystalline semiconductor layer covers the first polycrystalline semiconductor layer, wherein a relation represented by the inequality of $1-x2-y2 > 1-x1-y1$ holds between both the compositions of the semiconductor layer and the buffer layer.

2. The method of claim 1, wherein in the step (b), the first polycrystalline semiconductor is formed as substantially a continuous film.

3. The method of claim 1, wherein the temperature of the substrate is lower when the step (b) is performed than that when the step (c) is performed.

4. The fabrication method of claim 1, wherein the difference between the substrate temperatures in the steps (b) and (c) is within the range from 10° C. to 100° C.

5. The fabrication method of claim 1, wherein in the step (a), the substrate is held at a high temperature and then the substrate temperature is reduced to a level where the step (b) is performed and wherein nuclei for epitaxial growth of the first or second polycrystalline semiconductor layer to be performed in the step (c) are formed on the insulating layer at a time point during the temperature reduction in the step (a).

6. The fabrication method of claim 1, wherein the semiconductor layer is an SiGe layer or an SiGeC layer and wherein the buffer layer is a silicon layer.

7. The fabrication method of claim 1, wherein the underlying layer is a collector layer, wherein the semiconductor layer has at least part serving as a base layer and wherein the first and second polycrystalline semiconductor layers serve as at least parts of a base lead-electrode, the semiconductor device functioning as a heterojunction bipolar transistor.

8. The fabrication method of claim 7, wherein the first and second polycrystalline layers serve at least parts of an MIS transistor, the semiconductor device functioning as a BiCMOS device.

9. The fabrication method of claim 1, wherein the steps (b) and (c) are performed under ultra-high vacuum.

10. The fabrication method of claim 1, wherein the temperature of the substrate is in the range from 400° C. to 650° C. when the steps (b) and (c) are performed.

* * * * *